(12) United States Patent
Gu et al.

(10) Patent No.: US 12,431,066 B2
(45) Date of Patent: Sep. 30, 2025

(54) DISPLAY PANEL AND DISPLAY DEVICE INCLUDING THE SAME

(71) Applicant: Samsung Display Co., LTD., Yongin-si (KR)

(72) Inventors: Bon-Seog Gu, Yongin-si (KR); Jaekeun Lim, Yongin-si (KR); Hae-Kwan Seo, Yongin-si (KR); Jinyoung Roh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 209 days.

(21) Appl. No.: 18/203,084

(22) Filed: May 30, 2023

(65) Prior Publication Data

US 2024/0087504 A1 Mar. 14, 2024

(30) Foreign Application Priority Data

Sep. 7, 2022 (KR) ........................ 10-2022-0113720

(51) Int. Cl.
*G09G 3/32* (2016.01)
(52) U.S. Cl.
CPC ....... *G09G 3/32* (2013.01); *G09G 2300/0426* (2013.01); *G09G 2300/0452* (2013.01); *G09G 2310/0278* (2013.01); *G09G 2330/021* (2013.01)
(58) Field of Classification Search
CPC ............. G09G 3/32; G09G 2300/0426; G09G 2300/0452; G09G 2310/0278; G09G 2330/021; G09G 2300/0842; G09G 2310/0251; G09G 2310/0262; G09G 3/3233; G09G 3/3225; G09G 2300/0809; G09G 3/3275; G09G 2300/0439; H10K 59/351; H10K 59/131; H10K 59/1213; H10K 50/813; H10K 59/124; H10K 59/353

See application file for complete search history.

(56) References Cited

U.S. PATENT DOCUMENTS

| | | | | |
|---|---|---|---|---|
| 2010/0110114 | A1* | 5/2010 | Hashimoto | G09G 3/3614 345/88 |
| 2021/0201785 | A1* | 7/2021 | Kim | H10K 59/131 |
| 2022/0115478 | A1* | 4/2022 | Nam | H10K 59/131 |

FOREIGN PATENT DOCUMENTS

| | | |
|---|---|---|
| CN | 113823214 A | 12/2021 |
| KR | 1020220048519 A | 4/2022 |

\* cited by examiner

*Primary Examiner* — Matthew A Eason
*Assistant Examiner* — Chayce R Bibbee
(74) *Attorney, Agent, or Firm* — CANTOR COLBURN LLP

(57) ABSTRACT

A display panel of a display device includes: first to fourth pixel circuits connected to first to fourth data lines, respectively; first to fourth light emitting elements for emitting light of different colors; a first connection line for connecting the first light emitting element to the second pixel circuit; a second connection line for connecting the second light emitting element to the first pixel circuit; a third connection line for connecting the third light emitting element to the fourth pixel circuit; and a fourth connection line for connecting the fourth light emitting element to the third pixel circuit.

20 Claims, 11 Drawing Sheets

DISPLAY PANEL AND DISPLAY DEVICE INCLUDING THE SAME

This application claims priority to Korean Patent Application No. 10-2022-0113720 filed on Sep. 7, 2022, and all the benefits accruing therefrom under 35 U.S.C. § 119, the content of which in its entirety is herein incorporated by reference.

BACKGROUND

Embodiments of the present disclosure described herein relate to a display device.

In general, a display device includes a display panel for displaying an image and a driving circuit for driving the display panel. The display panel includes a plurality of scan lines, a plurality of data lines, and a plurality of pixels. The driving circuit includes a data driving circuit that outputs data driving signals to the data lines, a scan driving circuit that outputs scan signals for driving the scan lines, and a driving controller for controlling the data driving circuit and the scan driving circuit.

This display device may display an image by outputting a scan signal to a scan line connected to a pixel to be displayed and providing a data line connected to the pixel with a data voltage corresponding to the image to be displayed.

In addition, each of the plurality of pixels may provide one of various lights of color, such as red light, green light, and blue light. Each of the plurality of pixels may include a light emitting element and a pixel circuit for driving the light emitting element. Sizes of the plurality of pixels and arrangement methods of the plurality of pixels may vary.

SUMMARY

Embodiments of the present disclosure provide a display panel having reduced power consumption and a display device including the same.

According to an embodiment, a display panel includes: a first data line, a second data line, a third data line, a fourth data line, a first pixel circuit arranged in a first row and connected to the first data line, a second pixel circuit arranged in the first row and connected to the second data line, a third pixel circuit arranged in a second row and connected to the third data line, a fourth pixel circuit arranged in the second row and connected to the fourth data line, first to fourth light emitting elements for emitting light of different colors, a first connection line for connecting the first light emitting element to the second pixel circuit, a second connection line for connecting the second light emitting element to the first pixel circuit, a third connection line for connecting the third light emitting element to the fourth pixel circuit, and a fourth connection line for connecting the fourth light emitting element to the third pixel circuit. The first connection line and the second connection line overlap the second data line on a plane. The third connection line and the fourth connection line overlap the third data line on a plane.

In an embodiment, a part of the first light emitting element may overlap the first pixel circuit on a plane. A part of the second light emitting element may overlap the second pixel circuit on a plane. A part of the third light emitting element may overlap the third pixel circuit on a plane. A part of the fourth light emitting element may overlap the fourth pixel circuit on a plane.

In an embodiment, the first light emitting element may emit first color light. The second light emitting element may emit second color light. The third light emitting element may emit third color light. The fourth light emitting element may emit fourth color light.

In an embodiment, the first color light, the second color light, the third color light, and the fourth color light may correspond to blue, red, green, and white respectively.

In an embodiment, the first data line may deliver a first data signal corresponding to the first color light. The second data line may deliver a second data signal corresponding to the second color light. The third data line may deliver a third data signal corresponding to the third color light. The fourth data line may deliver a fourth data signal corresponding to the fourth color light.

In an embodiment, the first data line may be adjacent to a left side of the first pixel circuit. The second data line may be adjacent to a right side of the second pixel circuit and is positioned between the second pixel circuit and the third pixel circuit. The third data line may be adjacent to a left side of the third pixel circuit and is positioned between the second pixel circuit and the third pixel circuit. The fourth data line may be adjacent to a right side of the fourth pixel circuit.

According to an embodiment, a display panel includes: a first data line, a second data line, a third data line, a fourth data line, a first pixel arranged in a first row and connected to the first data line, a second pixel arranged in the first row and connected to the second data line, a third pixel arranged in a second row and connected to the third data line, and a fourth pixel arranged in the second row and connected to the fourth data line. The first pixel includes a first pixel circuit and a second light emitting element. The second pixel includes a second pixel circuit overlapping the second light emitting element, and a first light emitting element overlapping the first pixel circuit in a plan view. The third pixel includes a third pixel circuit and a fourth light emitting element. The fourth pixel includes a fourth pixel circuit overlapping the fourth light emitting element, and a third light emitting element overlapping the third pixel circuit in the plan view. The first light emitting element, the second light emitting element, the third light emitting element, and the fourth light emitting elements emit different color lights from one another.

In an embodiment, the display panel may further include: a first connection line for connecting the first light emitting element to the second pixel circuit, a second connection line for connecting the second light emitting element to the first pixel circuit, a third connection line for connecting the third light emitting element to the fourth pixel circuit, and a fourth connection line for connecting the fourth light emitting element to the third pixel circuit. The first connection line and the second connection line may overlap the second data line on a plane. the third connection line and the fourth connection line may overlap the third data line on a plane.

In an embodiment, the first light emitting element may emit first color light. The second light emitting element may emit second color light. The third light emitting element may emit third color light. The fourth light emitting element may emit fourth color light.

In an embodiment, the first color light, the second color light, the third color light, and the fourth color light may correspond to blue, red, green, and white respectively.

In an embodiment, the first data line may deliver a first data signal corresponding to the first color light. The second data line may deliver a second data signal corresponding to the second color light. The third data line may deliver a third data signal corresponding to the third color light. The fourth data line may deliver a fourth data signal corresponding to the fourth color light.

According to an embodiment, a display device includes: a display panel including first to fourth pixels connected to a plurality of insulating layers, first to fourth connection lines, and the first to fourth data lines. The first pixel includes a second light emitting element including an anode and a cathode, and a first pixel circuit. The second pixel includes a first light emitting element including an anode and a cathode, and a second pixel circuit. The plurality of insulating layers includes a first insulating layer disposed on the first pixel circuit and the second pixel circuit, a second insulating layer disposed on the first insulating layer, and a third insulating layer disposed on the second insulating layer. The first to fourth data lines are interposed between the first insulating layer and the second insulating layer. The first to fourth connection lines are interposed between the second insulating layer and the third insulating layer. The anode of the first light emitting element and the anode of the second light emitting element are disposed on the third insulating layer. The anode of the first light emitting element is connected to the first connection line through a first connection node passing through the third insulating layer. The first connection line is connected to the second pixel circuit through a first contact hole passing through the second insulating layer and a second contact hole passing through the first insulating layer. The first connection line overlaps the second data line in a plan view.

In an embodiment, the anode of the second light emitting element may be connected to the second connection line through a second connection node passing through the third insulating layer. The second connection line may be connected to the first pixel circuit through a third contact hole passing through the second insulating layer and a fourth contact hole passing through the first insulating layer. The second connection line may overlap the second data line in the plan view.

In an embodiment, the first light emitting element may overlap the first pixel circuit, and the second light emitting element may overlap the second pixel circuit in the plan view.

In an embodiment, the third pixel may include: a fourth light emitting element including an anode and a cathode, and a third pixel circuit. The fourth pixel may include a third light emitting element including an anode and a cathode, and a fourth pixel circuit. The anode of the third light emitting element and the anode of the fourth light emitting element may be disposed on the third insulating layer. The anode of the third light emitting element may be connected to the third connection line through a third connection node passing through the third insulating layer. The third connection line may be connected to the fourth pixel circuit through a fifth contact hole passing through the second insulating layer and a sixth contact hole passing through the first insulating layer. The third connection line may overlap the third data line in the plan view.

In an embodiment, the anode of the fourth light emitting element and the anode of the fourth light emitting element may be disposed on the third insulating layer. The anode of the fourth light emitting element may be connected to the fourth connection line through a fourth connection node passing through the third insulating layer. The fourth connection line may be connected to the third pixel circuit through a seventh contact hole passing through the second insulating layer and an eighth contact hole passing through the first insulating layer. The fourth connection line may overlap the third data line in the plan view.

In an embodiment, the third light emitting element may overlap the third pixel circuit, and the fourth light emitting element may overlap the fourth pixel circuit in the plan view.

In an embodiment, the first pixel and the second pixel may be arranged in a first row. The third pixel and the fourth pixel may be arranged in a second row.

In an embodiment, the first light emitting element may emit first color light. The second light emitting element may emit second color light. The third light emitting element may emit third color light. The fourth light emitting element may emit fourth color light.

In an embodiment, the first data line may deliver a first data signal corresponding to the first color light. The second data line may deliver a second data signal corresponding to the second color light. The third data line may deliver a third data signal corresponding to the third color light. The fourth data line may deliver a fourth data signal corresponding to the fourth color light.

BRIEF DESCRIPTION OF THE FIGURES

The above and other aspects and features of the present disclosure will become apparent by describing in detail embodiments thereof with reference to the accompanying drawings.

DETAILED DESCRIPTION

Figure 1:
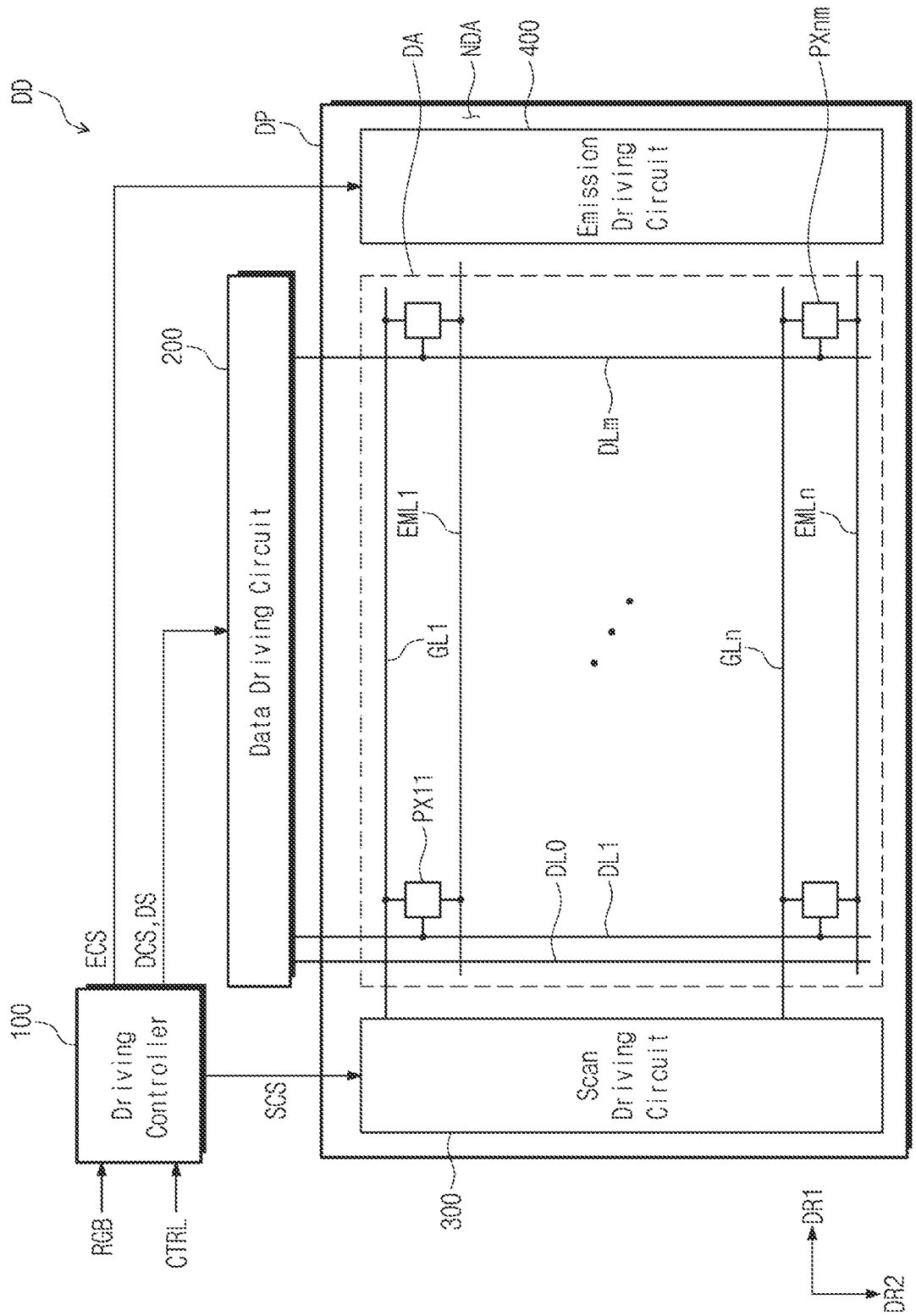
FIG. 1 is a block diagram of a display device, according to an embodiment of the present disclosure.

In the specification, the expression that a first component (or region, layer, part, etc.) is "on", "connected with", or "coupled with" a second component means that the first component is directly on, connected with, or coupled with the second component or means that a third component is interposed therebetween.

Like reference numerals refer to like components. Also, in drawings, the thickness, ratio, and dimension of components are exaggerated for effectiveness of description of technical contents. The term "and/or" includes one or more combinations of the associated listed items.

Although the terms "first", "second", etc. may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The articles "a," "an," and "the" are singular in that they have a single referent, but the use of the singular form in the specification should not preclude the presence of more than one referent.

Also, the terms "under", "beneath", "on", "above", etc. are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms (including technical terms and scientific terms) used in this specification have the same meaning as commonly understood by those skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

As used herein, both "on a plane" and "in a plan view" means a view in the third direction DR3. The third direction DR3 is perpendicular to the first direction DR1 and the second direction DR2. Hereinafter, embodiments of the present disclosure will be described with reference to accompanying drawings.

FIG. 1 is a block diagram of a display device, according to an embodiment of the present disclosure.

Referring to FIG. 1, a display device DD includes a driving controller 100, a data driving circuit 200, and a display panel DP.

The driving controller 100 receives an input image signal RGB and a control signal CTRL. The driving controller 100 generates an output image signal DS obtained by converting the input image signal RGB into an image type suitable for the display panel DP. The driving controller 100 outputs a scan control signal SCS and a data control signal DCS.

According to an embodiment of the present disclosure, the display panel DP may include a light emitting display panel. For example, the display panel DP may be an organic light emitting display panel, an inorganic light emitting display panel, or a quantum dot light emitting display panel. An emission layer of the organic light emitting display panel may include an organic light emitting material. An emission layer of the inorganic light emitting display panel may include an inorganic light emitting material. An emission layer of the quantum dot light emitting display panel may include a quantum dot, a quantum rod, or the like. Hereinafter, in an embodiment, the description will be given under the condition that the display panel DP is an organic light emitting display panel.

Figure 2:
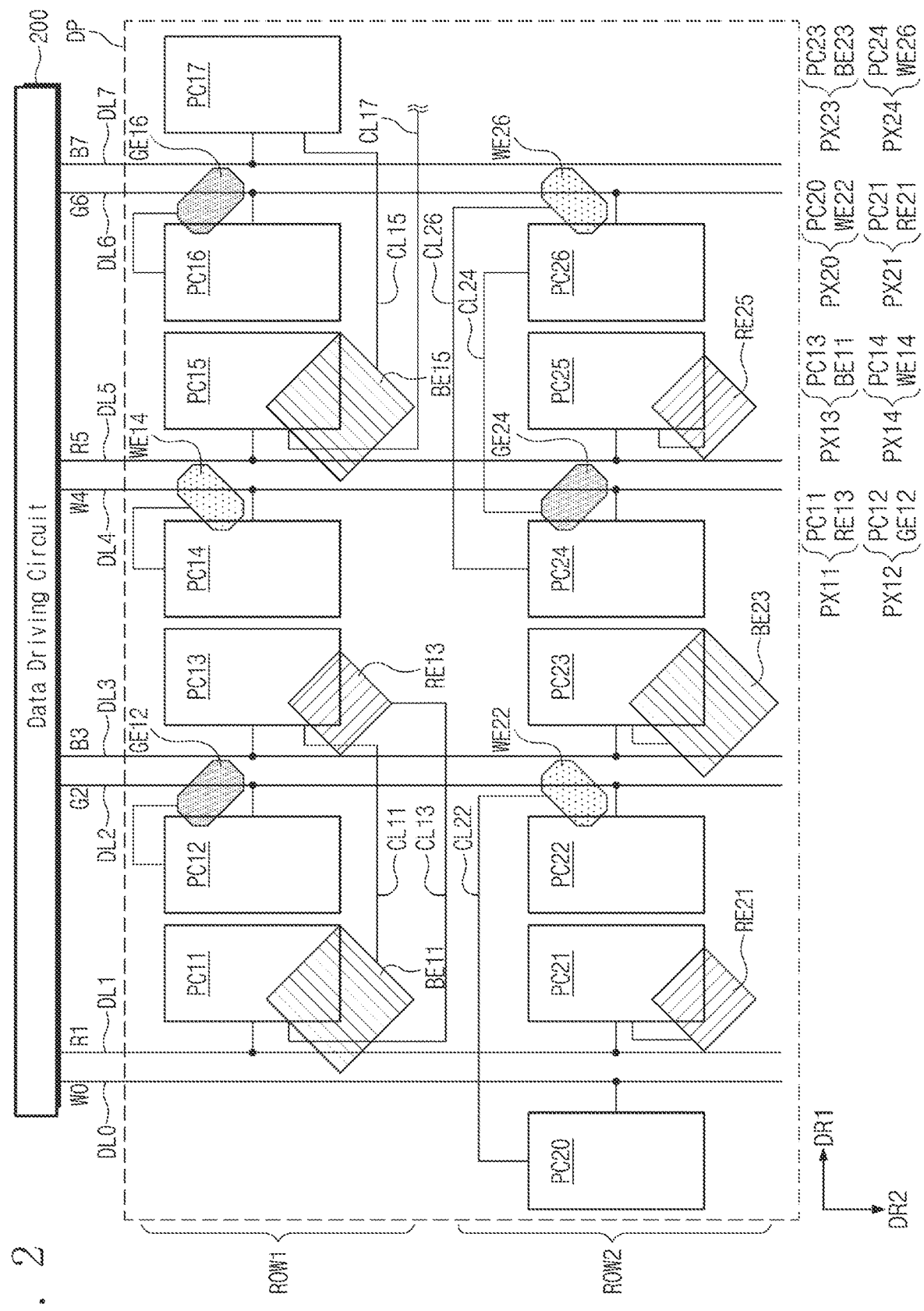
FIG. 2 is a diagram showing the arrangement of pixel circuits and light emitting elements of a pixel.

The display panel DP includes scan lines GL1 to GLn, data lines DL0 to DLm, and pixels PX11 to PXnm. The data line DL0 is omitted in FIG. 1, but FIG. 2 shows the data line DL0.

The display panel DP may include a display area DA and a non-display area NDA. In an embodiment, the display area DA has a rectangular shape, but the present disclosure is not limited thereto. The non-display area NDA may be in a form of a frame surrounding the display area DA.

The display panel DP may further include a scan driving circuit 300 and an emission driving circuit 400. The pixels PX11 to PXnm may be positioned in the display area DA. The scan driving circuit 300 and the emission driving circuit 400 may be positioned in the non-display area NDA.

The scan lines GL1 to GLn extend from the scan driving circuit 300 in a first direction DR1 and are arranged spaced from one another in a second direction DR2. Emission control lines EML1 to EMLn extend from the emission driving circuit 400 in a direction opposite to the first direction DR1 and are arranged spaced from one another in the second direction DR2. The data lines DL0 to DLm extend from the data driving circuit 200 in the second direction DR2 and are arranged spaced from one another in the first direction DR1.

Each of the pixels PX11 to PXnm may be connected to a corresponding scan line among the scan lines GL1 to GLn, may be connected to a corresponding data line among the data lines DL0 to DLm, and may be connected to a corresponding emission control line among the emission control lines EML1 to EMLn. FIG. 1 illustrates that each of the plurality of the pixels PX11 to PXnm is connected to one scan line, but the present disclosure is not limited thereto. For example, each of the plurality of the pixels PX11 to PXnm may be electrically connected to two or more scan lines in another embodiment.

Each of the pixels PX11 to PXnm may include a light emitting element and a pixel circuit for controlling the emission of the light emitting element. The light emitting element and the pixel circuit will be described in detail later.

The data driving circuit 200 receives the data control signal DCS and the output image signal DS from the driving controller 100. The data driving circuit 200 converts the output image signal DS into data signals and outputs the data signals to the data lines DL0 to DLm. Each of the data signals may have a voltage level corresponding to a gray-scale level of the output image signal DS.

The data driving circuit 200 may be implemented as an integrated circuit ("IC"). The data driving circuit 200 having an IC type may be directly mounted in a predetermined area of the display panel DP or may be mounted on a separate printed circuit board in a chip on film ("COF") scheme, and then may be electrically connected to the display panel DP. In an embodiment, the data driving circuit 200 may be formed in the same process as a pixel circuit of each of the pixels PX11 to PXnm on the display panel DP.

The scan driving circuit 300 receives the scan control signal SCS from the driving controller 100. The scan driving circuit 300 may output scan signals to the scan lines GL1 to GLn in response to the scan control signal SCS. In an embodiment, the scan driving circuit 300 may be formed in the same process as a pixel circuit of each of the pixels PX11 to PXnm.

The emission driving circuit 400 receives an emission driving signal ECS from the driving controller 100. The emission driving circuit 400 may output emission control signals to the emission control lines EML1 to EMLn in response to the emission driving signal ECS. In an embodiment, the emission driving circuit 400 may be formed in the same process as a pixel circuit of each of the pixels PX11 to PXnm. The emission driving circuit 400 is illustrated in FIG. 1, but the present disclosure is not limited thereto. In an embodiment, the emission driving circuit 400 may be included in the scan driving circuit 300 in another embodiment.

The driving controller 100, the data driving circuit 200, the scan driving circuit 300, and the emission driving circuit 400 may be a driving circuit for providing a data signal corresponding to the input image signal RGB to the pixels PX11 to PXnm.

FIG. 2 is a diagram showing the arrangement of pixel circuits and light emitting elements of a pixel.

Referring to FIG. 2, the display panel DP includes data lines DL0 to DL7, first pixel circuits PC11 to PC17, second pixel circuits PC20 to PC26, first light emitting elements BE11, BE15, and BE23, second light emitting elements GE12, GE16, and GE24, third light emitting elements RE13, RE21, and RE25, and fourth light emitting elements WE14, WE22, and WE26. The size and arrangement of each of the first pixel circuits PC11 to PC17, the size and arrangement of each of the second pixel circuits PC20 to PC26, the size and arrangement of each of the first light emitting elements BE11, BE15, and BE23, the size and arrangement of each of the second light emitting elements GE12, GE16, and GE24, the size and arrangement of each of the third light emitting elements RE13, RE21, and RE25, and the size and arrangement of each of the fourth light emitting elements WE14, WE22, and WE26 are only examples for understanding of the description, but the present disclosure is not limited thereto.

The first pixel circuits PC11 to PC17 may be arranged in a first row ROW1 and may be sequentially arranged in the first direction DR1. The second pixel circuits PC20 to PC26 may be arranged in a second row ROW2 and may be sequentially arranged in the first direction DR1.

The data lines DL0 to DL7 extend from the data driving circuit 200 in the second direction DR2 and are arranged spaced from one another in the first direction DR1. Two data lines among the data lines DL0 to DL7 may be arranged adjacent to each other. In other words, the data lines DL0 and DL1 are arranged adjacent to each other; the data lines DL2 and DL3 are arranged adjacent to each other; the data lines DL4 and DL5 are arranged adjacent to each other; and the data lines DL6 and DL7 are arranged adjacent to each other.

Each of the first pixel circuits PC11 to PC17 is connected to a corresponding data line among the data lines DL1 to DL7, and each of the second pixel circuits PC20 to PC26 is connected to a corresponding data line among the data lines DL0 to DL6.

In an embodiment, the first pixel circuits PC11, PC13, PC15, and PC17 among the first pixel circuits PC11 to PC17 and the second pixel circuits PC21, PC23 and PC25 among the second pixel circuits PC20 to PC26 are connected to the data lines DL1, DL3, DL5, and DL7 that are adjacent to a left side thereof.

In an embodiment, the first pixel circuits PC12, PC14, and PC16 among the first pixel circuits PC11 to PC17 and the second pixel circuits PC20, PC22, PC24, and PC26 among the second pixel circuits PC20 to PC26 are connected to the data lines DL0, DL2, DL4, and DL6 that are adjacent to a right side thereof.

The first light emitting elements BE11 and BE15, the second light emitting elements GE12 and GE16, the third light emitting element RE13, and the fourth light emitting element WE14 are arranged in the first row ROW1. Each of the first light emitting element BE11, the first light emitting element BE15, the second light emitting element GE12, the second light emitting element GE16, the third light emitting element RE13, and the fourth light emitting element WE14 may correspond to one of the first pixel circuits PC11 to PC16.

The first light emitting element BE11, the second light emitting element GE12, the third light emitting element RE13, the fourth light emitting element WE14, the first light emitting element BE15, and the second light emitting element GE16 may be sequentially arranged in the first row ROW1 in the first direction DR1.

Each of the first light emitting element BE11, the second light emitting element GE12, the third light emitting element RE13, the fourth light emitting element WE14, the first light emitting element BE15, and the second light emitting element GE16 may partially overlap a corresponding one of the first pixel circuits PC11 to PC16 on a plane (i.e., in a plan view). For example, a part of the first light emitting element BE11 overlaps the first pixel circuit PC11, and a part of the second light emitting element GE12 overlaps the first pixel circuit PC12 in a plan view.

The first light emitting elements BE23, the second light emitting element GE24, the third light emitting elements RE21 and RE25, and the fourth light emitting elements WE22 and WE26 are arranged in the second row ROW2. Each of the first light emitting elements BE23, the second light emitting element GE24, the third light emitting element RE21, the third light emitting element RE25, the fourth light emitting element WE22, and the fourth light emitting element WE26 may correspond to one of the second pixel circuits PC20 to PC26.

The third light emitting element RE21, the fourth light emitting element WE22, the first light emitting element BE23, the second light emitting element GE24, the third light emitting element RE25, and the fourth light emitting element WE26 may be sequentially arranged in the second row ROW2 in the first direction DR1.

Each of the third light emitting element RE21, the fourth light emitting element WE22, the first light emitting element BE23, the second light emitting element GE24, the third light emitting element RE25, and the fourth light emitting element WE26 may be may partially overlap one of the second pixel circuits PC20 to PC26. For example, a part of the third light emitting element RE21 overlaps the second pixel circuit PC21, and a part of the fourth light emitting element WE22 overlaps the second pixel circuit PC22 in a plan view.

In an embodiment, each of the first light emitting elements BE11, BE15, and BE23 may emit first color light; each of the second light emitting elements GE12, GE16, and GE24 may emit second color light; each of the third light emitting elements RE13, RE21, and RE25 may emit third color light; and each of the fourth light emitting elements WE14, WE22, and WE26 may emit fourth color light.

In an embodiment, the first to fourth color lights may be different color lights from one another. In another embodiment, the first to third color lights may be different color lights, and the fourth color light may be the same as one of the first color light, the second color light, and the third color light.

In an embodiment, the first color light, the second color light, the third color light, and the fourth color light may be blue, green, red, and white, respectively. However, the present disclosure is not limited thereto. In another embodiment, the first color light, the second color light, the third color light, and the fourth color light may be various color lights such as blue, green, red, white, cyan, magenta, and yellow.

The first light emitting element BE11 of the first row ROW1 is electrically connected to the first pixel circuit PC13 through a connection line CL11. The third light emitting element RE13 of the first row ROW1 is electrically connected to the first pixel circuit PC11 through a connection line CL13. The first light emitting element BE15 of the first row ROW1 is electrically connected to the first pixel circuit PC17 through a connection line CL15.

The second light emitting elements GE12 and GE16 of the first row ROW1 are electrically connected to the first pixel circuits PC12 and PC16, respectively. The fourth light emitting element WE14 of the first row ROW1 is electrically connected to the first pixel circuit PC14.

The fourth light emitting element WE22 of the second row ROW2 is electrically connected to the second pixel circuit PC20 through a connection line CL22. The second light emitting element GE24 of the second row ROW2 is electrically connected to the second pixel circuit PC26 through a connection line CL24. The fourth light emitting element WE26 of the second row ROW2 is electrically connected to the second pixel circuit PC24 through a connection line CL26.

The third light emitting elements RE21 and RE25 of the second row ROW2 are electrically connected to the second pixel circuits PC21 and PC25, respectively. The first light emitting element BE23 of the second row ROW2 is electrically connected to the second pixel circuit PC23.

The first pixel circuit PC11 and the second pixel circuit PC21 of a first column may be connected to third light emitting elements RE13 and RE21 that emit the third color light, respectively.

The first pixel circuit PC12 of a second column may be connected to the second light emitting element GE12 that emits the second color light.

The first pixel circuit PC13 and the second pixel circuit PC23 of a third column may be connected to the first light emitting elements BE11 and BE23 that emit the first color light, respectively.

The first pixel circuit PC14 and the second pixel circuit PC24 of a fourth column may be connected to the fourth light emitting elements WE14 and WE26 that emit the fourth color light, respectively.

The second pixel circuit PC25 of a fifth column may be connected to the third light emitting element RE25 that emits the third color light.

The first pixel circuit PC16 and the second pixel circuit PC26 of a sixth column may be connected to the second light emitting elements GE16 and GE24 that emit the second color light, respectively.

The first pixel circuit PC17 of a seventh column may be connected to the first light emitting element BE15 that emits the first color light.

In an embodiment, each of the pixels PX11 to PXnm illustrated in FIG. 1 may be implemented to include a pixel circuit such as one of the first pixel circuits PC11 to PC17 and the second pixel circuits PC20 to PC26.

In an embodiment, each of the pixels PX11 to PXnm shown in FIG. 1 may be implemented to include a light emitting element such as one of the first light emitting elements BE11, BE15, and BE23, the second light emitting elements GE12, GE16, and GE24, the third light emitting elements RE13, RE21, and RE25, the fourth light emitting elements WE14, WE22, and WE26.

For example, the pixel PX11 illustrated in FIG. 1 may include the first pixel circuit PC11 and the third light emitting element RE13. The pixel PX12 may include the first pixel circuit PC12 and the second light emitting element GE12. The pixel PX13 may include the first pixel circuit PC13 and the first light emitting element BE11. The pixel PX14 may include the first pixel circuit PC14 and the fourth light emitting element WE14. The pixel PX20 may include the second pixel circuit PC20 and the fourth light emitting element WE22. The pixel PX21 may include the second pixel circuit PC21 and the third light emitting element RE21. The pixel PX23 may include the second pixel circuit PC23 and the first light emitting element BE23. The pixel PX24 may include the second pixel circuit PC24 and the fourth light emitting element WE26.

The pixel circuit PC20 connected to the data line DL0 is connected to the fourth light emitting element WE22. The first and second pixel circuits PC11 and PC21 connected to the data line DL1 are connected to the third light emitting elements RE13 and RE21, respectively. The first pixel circuit PC12 connected to the data line DL2 is connected to the second light emitting element GE12. The first and second pixel circuits PC13 and PC23 connected to the data line DL3 are connected to the first light emitting elements BE11 and BE23, respectively. The first and second pixel circuits PC14 and PC24 connected to the data line DL4 are connected to the fourth light emitting elements WE14 and WE26, respectively. The second pixel circuit PC25 connected to the data line DL5 is connected to the third light emitting element RE25. The first and second pixel circuits PC16 and PC26 connected to the data line DL6 are connected to the second light emitting elements GE16 and GE24, respectively. The pixel circuit PC17 connected to the data line DL7 is connected to the first light emitting element BE15.

Accordingly, the data driving circuit 200 may output data signals corresponding to specific colors to the data lines DL0 to DL7. For example, the data driving circuit 200 outputs data signals W0 and W4 corresponding to white colors to the data lines DL0 and DL4, respectively. The data driving circuit 200 outputs data signals R1 and R5 corresponding to red colors to the data lines DL1 and DL5, respectively. The data driving circuit 200 outputs data signals G2 and G6 corresponding to green colors to the data lines DL2 and DL6, respectively. The data driving circuit 200 outputs data signals B3 and B7 corresponding to blue colors to the data lines DL3 and DL7, respectively. The data driving circuit 200 may output only a data signal corresponding to a specific color to each of the data lines DL0 to DL7, thereby reducing power consumption.

Figure 3:
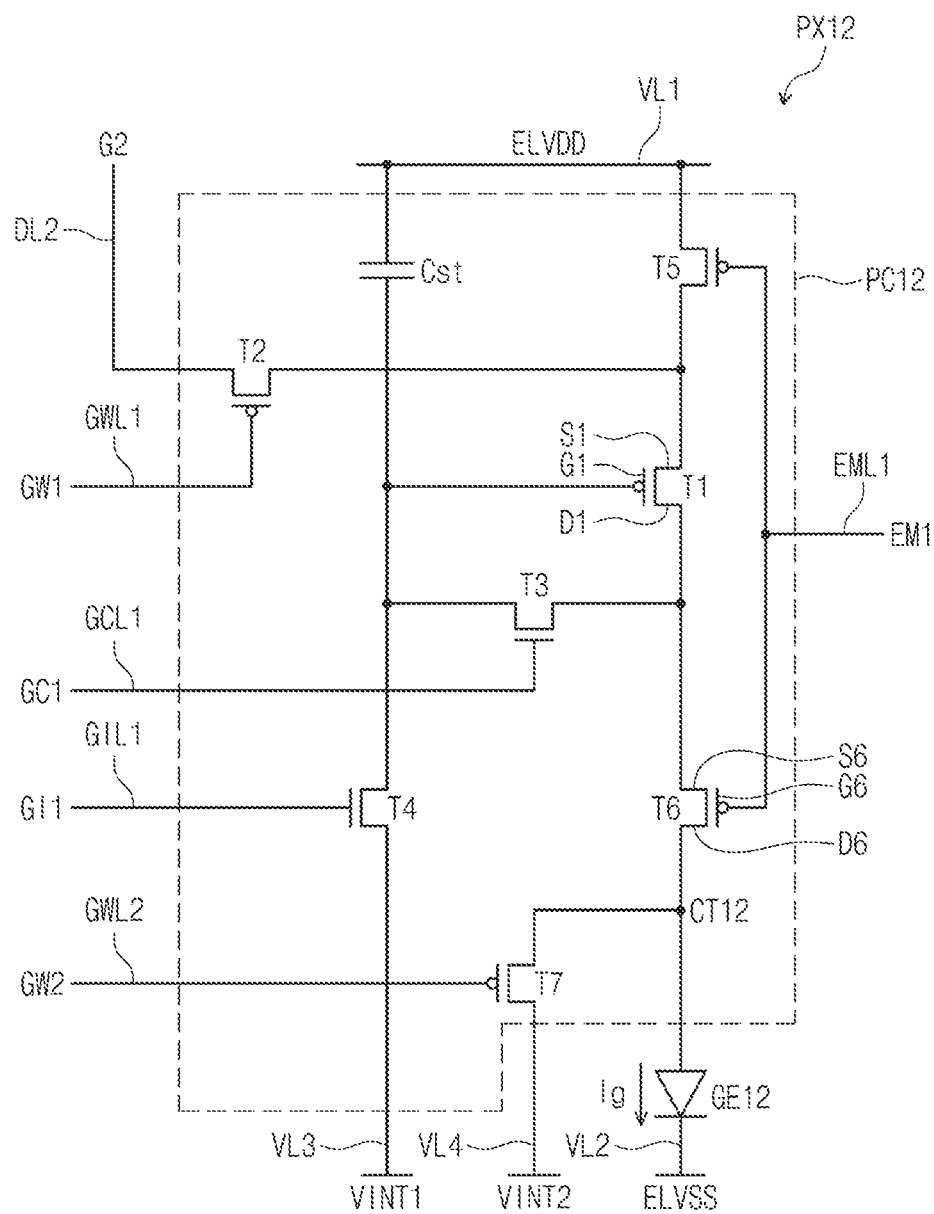
FIG. 3 is a circuit diagram of a pixel, according to an embodiment of the present disclosure.

FIG. 3 is a circuit diagram of the pixel PX12, according to an embodiment of the present disclosure.

FIG. 3 illustrates the pixel circuit PC12 and the second light emitting element GE12, which constitute the pixel PX12. Each of the pixels PX12 and PX14 arranged in the first row ROW1 shown in FIG. 2 or each of the pixels PX21 and PX23 arranged in the second row ROW2 shown in FIG. 2 may have the same circuit configuration as the pixel PX12 shown in FIG. 3.

Referring to FIG. 3, the pixel PX12 includes the pixel circuit PC12 and the second light emitting element GE12. In an embodiment, the second light emitting element GE12 may be a light emitting diode. The second light emitting element GE12 of the pixel PX12 may emit second color light (e.g., green).

In an embodiment, the pixel circuit PC12 may include at least one transistor and at least one capacitor. The pixel circuit PC12 shown in FIG. 3 includes first to seventh transistors T1, T2, T3, T4, T5, T6, and T7, and a capacitor Cst. The pixel circuit PC12 illustrated in FIG. 3 is only an example. For example, the configuration of the pixel circuit PC12 may be modified and implemented.

In an embodiment, the third and fourth transistors T3 and T4 among the first to seventh transistors T1 to T7 are N-type transistors by using an oxide semiconductor as a semiconductor layer. Each of the first, second, fifth, sixth, and seventh transistors T1, T2, T5, T6, and T7 is a P-type transistor having a low-temperature polycrystalline silicon ("LTPS") semiconductor layer. However, the present disclosure is not limited thereto. In an embodiment, all of the first to seventh transistors T1 to T7 may be P-type transistors or N-type transistors. In an embodiment, at least one of the first to seventh transistors T1 to T7 may be an N-type transistor, and the other(s) thereof may be P-type transistors.

In an embodiment, the pixel circuit PC12 may be electrically connected to the one data line DL2, four scan lines GIL1, GCL1, GWL1, and GWL2, and the one emission control line EML1. Each of the scan lines GL1 to GLn illustrated in FIG. 1 may include a plurality of scan lines. In an embodiment, the scan line GL1 illustrated in FIG. 1 may include four scan lines GIL1, GCL1, GWL1, and GWL2.

The scan lines GIL1, GCL1, GWL1, and GWL2 may deliver the scan signals GI1, GC1, GW1, and GW2, respectively. The emission control line EML1 may deliver an emission control signal EM1. The data line DL2 delivers the data signal G2. The data signal G2 may have a voltage level corresponding to the image signal RGB input to the display device DD (see FIG. 1). First to fourth driving voltage lines VL1, VL2, VL3, and VL4 may transfer a first driving voltage ELVDD, a second driving voltage ELVSS, a first initialization voltage VINT1, and a second initialization voltage VINT2, respectively.

The first transistor T1 includes a first electrode S1 connected to the first driving voltage line VL1 via the fifth transistor T5, a second electrode D1 electrically connected to an anode of the second light emitting element GE12 via the sixth transistor T6, and a gate electrode G1 connected to one end of the capacitor Cst.

The second transistor T2 includes a first electrode connected to the data line DL2, a second electrode connected to the first electrode S1 of the first transistor T1, and a gate electrode connected to the scan line GWL1. The second transistor T2 may be turned on in response to the scan signal GW1 received through the scan line GWL1 to deliver the data signal G2 delivered from the data line DL2 to the first electrode S1 of the first transistor T1. The data signal G2 delivered from the data line DL2 may be a second color signal.

The third transistor T3 includes a first electrode connected to the gate electrode G1 of the first transistor T1, a second electrode connected to the second electrode D1 of the first transistor T1, and a gate electrode connected to the scan line GCL1. The third transistor T3 may be turned on in response to the scan signal GC1 received through the scan line GCL1, and thus, the gate electrode G1 and the second electrode D1 of the first transistor T1 may be connected to each other, that is, the first transistor T1 may be diode-connected.

The fourth transistor T4 includes a first electrode connected to the gate electrode G1 of the first transistor T1, a second electrode connected to the third driving voltage line VL3 through which the first initialization voltage VINT1 is supplied, and a gate electrode connected with the scan line GIL1. The fourth transistor T4 may be turned on in response to the scan signal GI1 received through the scan line GIL1 such that the first initialization voltage VINT' is supplied to the gate electrode G1 of the first transistor T1. Accordingly, a voltage of the gate electrode G1 of the first transistor T1 may be initialized. This operation may be referred to as an "an initialization operation".

The fifth transistor T5 includes a first electrode connected to the first driving voltage line VL1, a second electrode connected to the first electrode S1 of the first transistor T1, and a gate electrode connected to the emission control line EML1.

The sixth transistor T6 includes a first electrode S6 connected to the second electrode D1 of the first transistor T1, a second electrode D6 connected to an anode of the second light emitting element GE12, and a gate electrode G6 connected to the emission control line EML1. The second electrode D6 of the sixth transistor T6 may be connected to an anode of the second light emitting element GE12 through a connection node CT12.

The fifth transistor T5 and the sixth transistor T6 may be simultaneously turned on in response to the emission control signal EM1 received through the emission control line EML1. As the fifth transistor T5 and the sixth transistor T6 are turned on, a current path may be formed from the first driving voltage line VL1 to the second light emitting element GE12 through the fifth transistor T5, the first transistor T1, and the sixth transistor T6. In this case, the current flowing through the first transistor T1 may correspond to charges charged in the capacitor Cst. Accordingly, a current Ig corresponding to the data signal G2 may be delivered to the second light emitting element GE12. In other words, the data signal G2 may be converted into the current Ig through the pixel circuit PC12, and then the current Ig may be provided to the second light emitting element GE12.

The seventh transistor T7 includes a first electrode connected to the second electrode D6 of the sixth transistor T6, a second electrode connected to the fourth driving voltage line VL4, and a gate electrode connected to the scan line GWL2. The seventh transistor T7 may be turned on in response to the scan signal GW2 received through the scan line GWL2 to initialize the anode of the second light emitting element GE12 to the second initialization voltage VINT2 from the fourth driving voltage line VL4.

The one end of the capacitor Cst is connected with the gate electrode G1 of the first transistor T1 as described above, and the other end of the capacitor Cst is connected with the first driving voltage line VL1. A cathode of the second light emitting element GE12 may be connected to the second driving voltage line VL2, through which the second driving voltage ELVSS is supplied.

Figure 4:
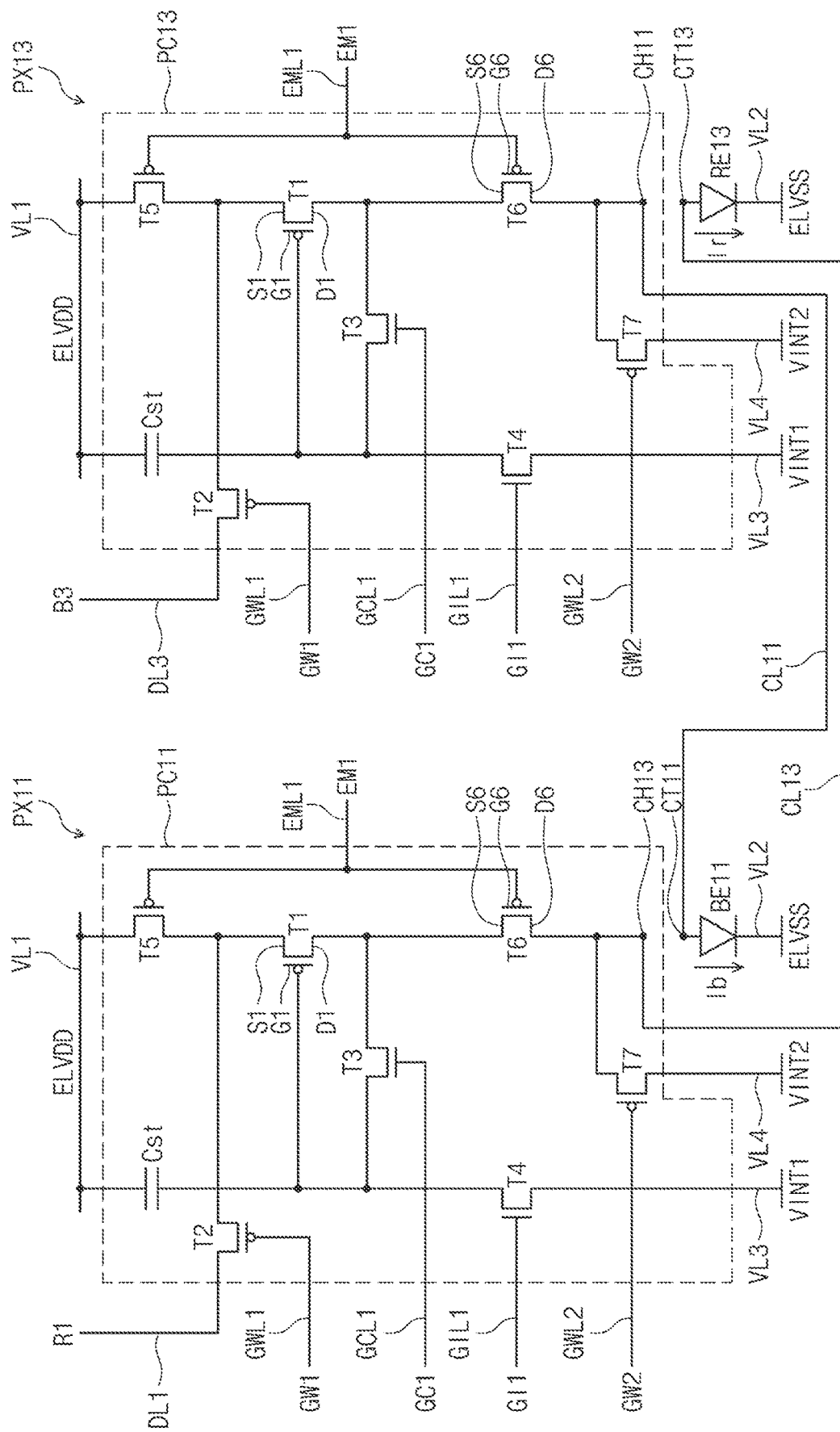
FIG. 4 is a circuit diagram of pixels, according to an embodiment of the present disclosure.

FIG. 4 is a circuit diagram of the pixel PX11 and the pixel PX13, according to an embodiment of the present disclosure.

Referring to FIG. 4, the pixel PX11 includes the pixel circuit PC11 and the third light emitting element RE13. The pixel PX13 includes the pixel circuit PC13 and the first light emitting element BE11.

The pixel circuit PC11 of the pixel PX11 and the pixel circuit PC13 of the pixel PX13 shown in FIG. 4 may each include a circuit configuration similar to the pixel circuit PC12 of the pixel PX12 shown in FIG. 3. The same reference numerals are used for components, which are the same as components of the pixel circuit PC12 of the pixel PX12 shown in FIG. 3, from among components of the pixel circuit PC11 of the pixel PX11 and components of the pixel circuit PC13 of the pixel PX13 shown in FIG. 4, and additional descriptions are omitted to avoid redundancy.

Referring to FIGS. 2 and 4, the first light emitting element BE11 arranged adjacent to (or partially overlapping) the pixel circuit PC11 of the pixel PX11 may be a light emitting element that emits first color light (e.g., blue light). In an embodiment, the pixel circuit PC11 of the pixel PX11 is electrically isolated from the first light emitting element BE11.

The third light emitting element RE13 arranged adjacent to (or partially overlapping) the pixel circuit PC13 of the pixel PX13 may be a light emitting element that emits third color light (e.g., red light). In an embodiment, the pixel circuit PC13 of the pixel PX13 is electrically isolated from the third light emitting element RE13.

In an embodiment, the pixel circuit PC11 of the pixel PX11 is electrically connected to the third light emitting element RE13 arranged adjacent to (or partially overlapping) the pixel circuit PC13 through a connection part CH11, the connection line CL13 and a connection node CT13. Accordingly, the data signal R1 delivered through the data line DL1 may be converted into a current Ir through the pixel circuit PC11 of the pixel PX11, and then the current Ir may be provided to the third light emitting element RE13.

In an embodiment, the pixel circuit PC13 of the pixel PX13 is electrically connected to the first light emitting element BE11 arranged adjacent to (or partially overlapping) the pixel circuit PC11 through a connection part CH11, the connection line CL11 and a connection node CT11. Accordingly, the data signal B3 delivered through the data line DL3 may be converted into a current Ib through the pixel circuit PC13 of the pixel PX13, and then the current Ib may be provided to the first light emitting element BE11.

Figure 5:
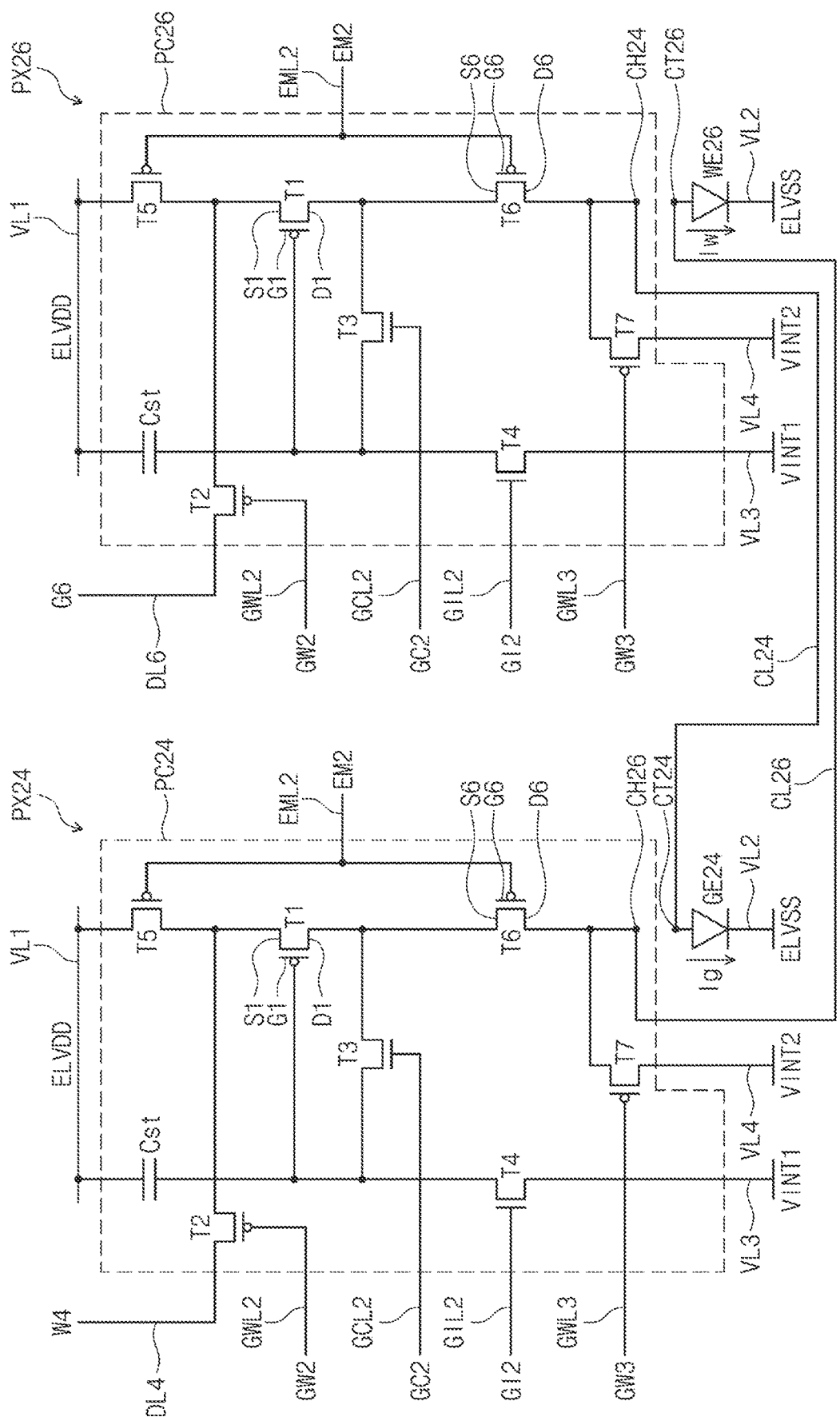
FIG. 5 is a circuit diagram of pixels, according to an embodiment of the present disclosure.

FIG. 5 is a circuit diagram of the pixel PX24 and a pixel PX26, according to an embodiment of the present disclosure.

Referring to FIG. 5, the pixel PX24 includes the pixel circuit PC24 and the fourth light emitting element WE26. The pixel PX26 includes the pixel circuit PC26 and the second light emitting element GE24.

The pixel circuit PC24 of the pixel PX24 and the pixel circuit PC26 of the pixel PX26 shown in FIG. 5 may each include a circuit configuration similar to the pixel circuit PC12 of the pixel PX12 shown in FIG. 3. The same reference numerals are used for components, which are the same as components of the pixel circuit PC12 of the pixel PX12 shown in FIG. 3, from among components of the pixel circuit PC24 of the pixel PX24 and components of the pixel circuit PC26 of the pixel PX26 shown in FIG. 5, and additional descriptions are omitted to avoid redundancy.

Referring to FIGS. 2 and 5, the second light emitting element GE24 arranged adjacent to (or partially overlapping) the pixel circuit PC24 of the pixel PX24 may be a light emitting element that emits second color light (e.g., green light). In an embodiment, the pixel circuit PC24 of the pixel PX24 is electrically isolated from the second light emitting element GE24.

The fourth light emitting element WE26 arranged adjacent to (or partially overlapping) the pixel circuit PC26 of the pixel PX26 may be a light emitting element that emits fourth color light (e.g., white light). In an embodiment, the pixel circuit PC26 of the pixel PX26 is electrically isolated from the fourth light emitting element WE26.

In an embodiment, the pixel circuit PC24 of the pixel PX24 is electrically connected to the fourth light emitting element WE26 arranged adjacent to (or partially overlapping) the pixel circuit PC26 through a connection part CH26 (or a contact hole), the connection line CL26 and a connection node CT26. Accordingly, the data signal W4 delivered through the data line DL4 may be converted into a current Iw through the pixel circuit PC24 of the pixel PX24, and then the current Iw may be provided to the fourth light emitting element WE26.

In an embodiment, the pixel circuit PC26 of the pixel PX26 is electrically connected to the second light emitting element GE24 arranged adjacent to (or partially overlapping) the pixel circuit PX24 through a connection part CH24 (or a contact hole), the connection line CL24 and a connection node CT24. Accordingly, the data signal G6 delivered through the data line DL6 may be converted into a current Ig through the pixel circuit PC26 of the pixel PX26, and then the current Ig may be provided to the second light emitting element GE24.

Figure 6:
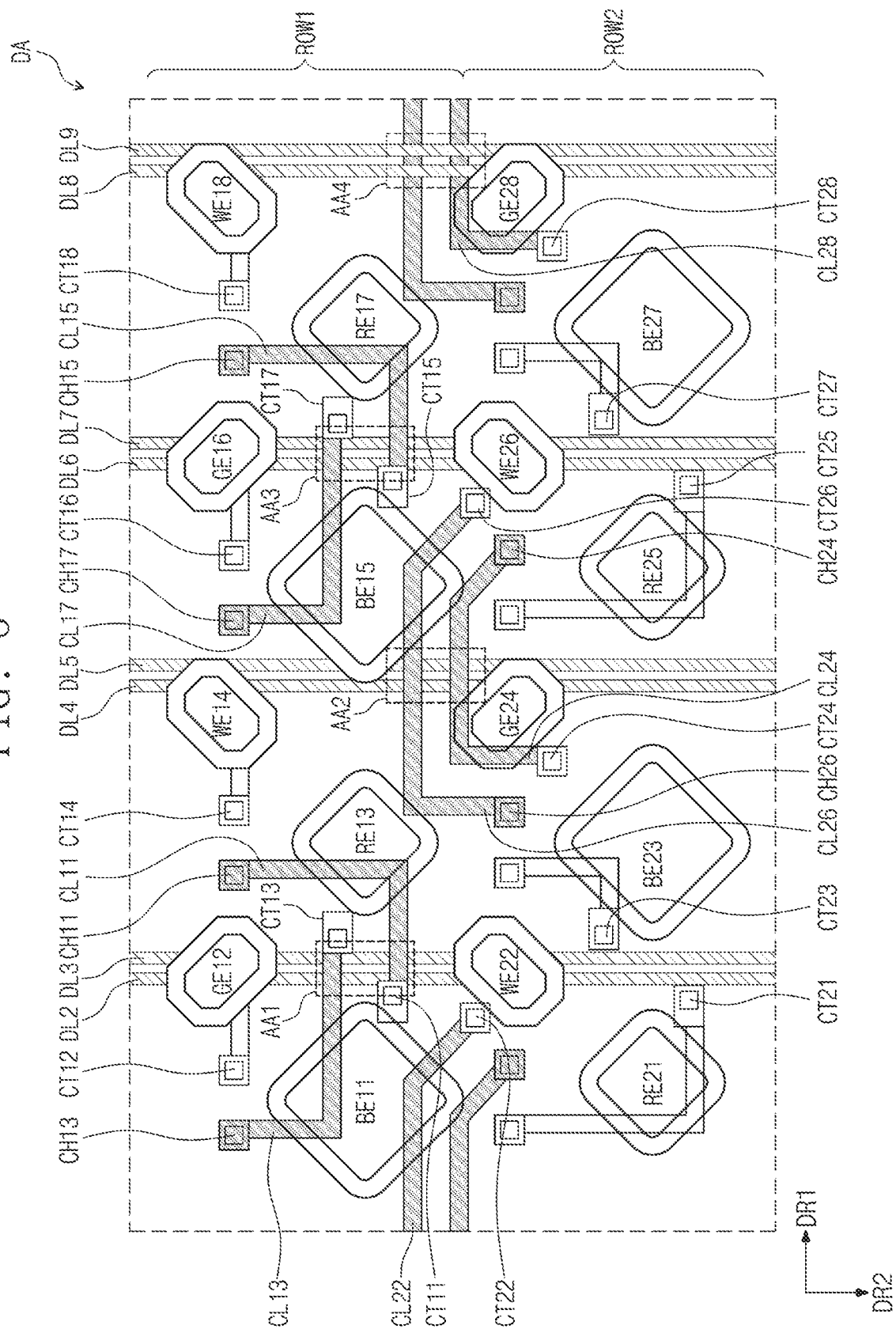
FIG. 6 is a plan view of a display panel according to an embodiment of the present disclosure.

FIG. 6 is a plan view of the display panel DP, according to an embodiment of the present disclosure.

FIG. 6 shows only some of the pixels shown in FIG. 2, and illustrates only layers including light emitting elements, connection nodes, connection lines, and connection parts. The plan view shown in FIG. 6 is only an example, and the present disclosure is not limited thereto.

Referring to FIG. 6, the first light emitting elements BE11 and BE15, the second light emitting elements GE12 and GE16, the third light emitting elements RE13 and RE17, and the fourth light emitting elements WE14 and WE18 are arranged in the first row ROW1. The first light emitting elements BE23 and BE27, the second light emitting elements GE24 and GE28, the third light emitting elements RE21 and RE25, and the fourth light emitting elements WE22 and WE26 are arranged in the second row ROW2.

Referring to FIGS. 2 and 6, the first light emitting element BE11 is electrically connected to the pixel circuit PC13 through the connection node CT11, the connection line CL11 and the connection part CH11. The second light emitting element GE12 is electrically connected to the pixel circuit PC12 through the connection node CT12. The third light emitting element RE13 is electrically connected to the pixel circuit PC11 through the connection node CT13, the connection line CL13 and the connection part CH13. The fourth light emitting element WE14 is electrically connected to the pixel circuit PC14 through a connection node CT14. The connection lines CL11 and CL13 overlap the data lines DL2 and DL3 in an area AA1 on a plane (i.e., in a plan view).

The first light emitting element BE15 is electrically connected to the pixel circuit PC17 through a connection node CT15, the connection line CL15 and the connection part CH15. The second light emitting element GE16 is electrically connected to the pixel circuit PC16 through a connection node CT16. The third light emitting element RE17 is electrically connected to the pixel circuit PC15 through a connection node CT17, the connection line CL17 and a connection part CH17. The fourth light emitting element WE18 is electrically connected to a pixel circuit (not illustrated) through a connection node CT18. The connection lines CL15 and CL17 overlap the data lines DL6 and DL7 in an area AA3 on a plane.

The third light emitting element RE21 is electrically connected to the pixel circuit PC21 through a connection node CT21. The fourth light emitting element WE22 is electrically connected to the pixel circuit PC20 through a connection node CT22, the connection line CL22 and a connection part (not illustrated). The first light emitting element BE23 is electrically connected to the pixel circuit PC23 through a connection node CT23. The second light emitting element GE24 is electrically connected to the pixel circuit PC26 through a connection node CT24, the connection line CL24 and the connection part CH24. The connection line CL24 overlaps the data lines DL4 and DL5 in an area AA2 on a plane.

The third light emitting element RE25 is electrically connected to the pixel circuit PC25 through a connection node CT25. The fourth light emitting element WE26 is electrically connected to the pixel circuit PC24 through a connection node CT26, the connection line CL26 and the connection part CH26. The first light emitting element BE27 is electrically connected to the pixel circuit PC27 through a connection node CT27. The second light emitting element GE28 is electrically connected to a pixel circuit (not illustrated) through a connection node CT28, a connection line CL28 and a connection part (not illustrated). The connection line CL26 overlaps the data lines DL4 and DL5 on a plane (i.e., in a plan view). The connection line CL28 overlaps the data lines DL8 and DL9 in an area AA4 on a plane.

Each of the connection lines CL11, CL13, CL15, CL17, CL24, CL26, and CL28 may be formed of a conductive layer including a metal material, and each of the data lines DL2 to DL9 may be formed of a conductive layer including a metal material. As the connection lines CL11, CL13, CL15, CL17, CL24, CL26, and CL28 overlap the data lines DL2 to DL9, coupling capacitance may be formed therebetween.

In the first row ROW1, the connection lines CL11, CL13, CL15, and CL17 connected to the first light emitting elements BE11 and BE15 and the third light emitting elements RE13 and RE17 overlap corresponding data lines among the data lines DL2 to DL7 in a plan view.

In the second row ROW2, the connection lines CL24, CL26, and CL28 connected to the second light emitting elements GE24 and GE28 and the fourth light emitting element WE26 overlap the corresponding data lines among the data lines DL2 to DL9.

That is, as the data lines DL2 to DL9 overlap the connection lines CL11, CL13, CL15, CL17, CL24, CL26, and CL28, a coupling capacitance deviation between the data lines DL2 to DL9 may be minimized.

When only some of the data lines DL2 to DL9 overlap some of the connection lines CL11, CL13, CL15, CL17, CL24, CL26, and CL28 in a plan view, the coupling capacitance deviation between the data lines DL2 to DL9 may occur. In this case, a luminance deviation between the first to fourth light emitting elements BE11, GE12, RE13, WE14, BE15, GE16, RE17, WE18, RE21, WE22, BE23, GE24, RE25, WE26, BE27, and GE28 may be perceived by a user.

Figure 7:
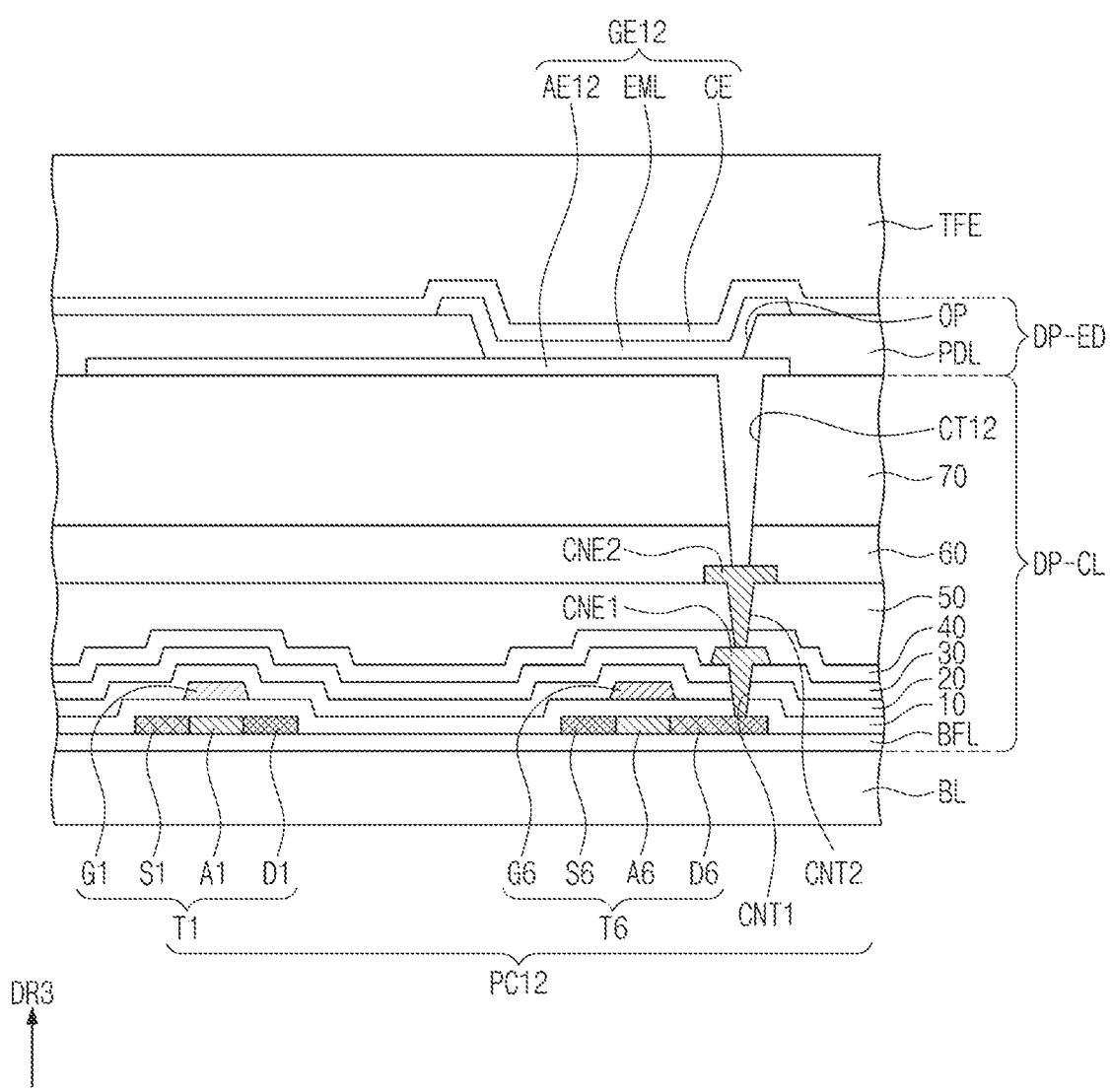
FIG. 7 is a diagram showing a cross-section of a part of a pixel circuit and a second light emitting element in a display panel, according to an embodiment of the present disclosure.

FIG. 7 is a diagram showing a cross-section of a part of the pixel circuit PC12 and the second light emitting element GE12 in the display panel DP, according to an embodiment of the present disclosure.

Referring to FIG. 7, the display panel DP may include a base layer BL, a circuit element layer DP-CL disposed on the base layer BL, a display element layer DP-ED, and a thin film encapsulation layer TFE. The display panel DP may further include functional layers such as a refractive-index adjustment layer, or the like. The circuit element layer DP-CL includes at least a plurality of insulating layers and a circuit element. Hereinafter, the insulating layers may include an organic layer and/or an inorganic layer.

An insulating layer, a semiconductor layer, and a conductive layer are formed through processes such as a coating process, a deposition process, and the like. Afterward, the insulating layer, the semiconductor layer, and the conductive layer may be selectively patterned through photolithography and etching processes. A semiconductor pattern, a conductive pattern, and a signal line are formed through the processes. Patterns disposed on the same layer are formed through the same process.

The base layer BL may include a synthetic resin film. The synthetic resin layer may include a thermosetting resin. In detail, the synthetic resin layer may be a polyimide-based resin layer, and the material thereof is not particularly limited thereto. The synthetic resin layer may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. Besides, the base layer BL may include a glass substrate, a metal substrate, an organic/inorganic composite substrate, or the like.

At least one inorganic layer is formed on an upper surface of the base layer BL. The inorganic layer may include at least one of aluminum oxide, titanium oxide, silicon oxide, silicon oxynitride, zirconium oxide, and hafnium oxide. The inorganic layer may be formed of multiple layers. At least one of the multi-layered inorganic layers may constitute a buffer layer BFL.

The buffer layer BFL improves a bonding force between the base layer BL and a semiconductor pattern and/or a conductive pattern. The buffer layer BFL may include a silicon oxide layer and a silicon nitride layer. The silicon oxide layer and the silicon nitride layer may be alternately stacked.

The semiconductor pattern is disposed on the buffer layer BFL. The semiconductor pattern may be directly disposed on the buffer layer BFL. The semiconductor pattern may include a silicon semiconductor. Each of the semiconductor patterns may include low-temperature polycrystalline silicon (LTPS). However, an embodiment is not limited thereto. For example, the semiconductor pattern may include amorphous silicon in another embodiment.

An electrical property of the semiconductor pattern varies depending on whether it is doped or not. The semiconductor pattern may include a doped area and an undoped area. The doped area may be doped with an N-type dopant or a P-type dopant. A P-type transistor includes a doped area doped with the P-type dopant.

The doped area has higher conductivity than the undoped area, and substantially operates as an electrode or a signal line. The undoped area substantially corresponds to an active area (or a channel area) of a transistor. In other words, a part of the semiconductor pattern may be an active area in a transistor; another part thereof may be a first electrode (a source electrode) or a second electrode (a drain electrode) of the transistor; and the other part thereof may be a connection electrode or a connection signal line (or a connection electrode).

As illustrated in FIG. 7, the first electrode S1, an active area A1, and the second electrode D1 of the first transistor T1 are formed from the semiconductor pattern. The first electrode S1 and the second electrode D1 of the first transistor T1 extend in opposite directions from the active area A1. In addition, the first electrode S6, an active area A6, and the second electrode D6 of the sixth transistor T6 are formed from the semiconductor pattern. The first electrode S6 and the second electrode D6 of the sixth transistor T6 extend in opposite directions from the active area A6. Although not shown separately, the first electrode S6 of the sixth transistor T6 may be connected to the second electrode D1 of the first transistor T1.

As shown in FIG. 3, the first electrode S6 of the sixth transistor T6 may be electrically connected to the second electrode D1 of the first transistor T1.

A first insulating layer 10 is disposed on the buffer layer BFL. The first insulating layer 10 overlaps the plurality of pixels PX11 to PX24 shown in FIG. 2 in common and covers the semiconductor pattern in a plan view. The first insulating layer 10 may be an inorganic layer and/or an organic layer, and may have a single layer or multi-layer structure. The first insulating layer 10 may include at least one of an aluminum oxide, a titanium oxide, a silicon oxide, a silicon oxynitride, a zirconium oxide, and a hafnium oxide. In an embodiment, the first insulating layer 10 may be a silicon oxide layer having a single layer structure. Not only the first insulating layer 10 but also an insulating layer of the circuit element layer DP-CL to be described later may be an inorganic layer and/or an organic layer, and may have a single layer structure or a multi-layer structure. The inorganic layer may include at least one of the materials described above.

The gate electrode G1 of the first transistor T1 is disposed on the first insulating layer 10. The gate electrode G1 may be a part of a metal pattern. The gate electrode G1 of the first transistor T1 overlaps the active area A1 of the first transistor T1. In a process of doping the semiconductor pattern, the gate electrode G1 of the first transistor T1 may function as a mask.

A second insulating layer 20 covering the gate electrode G1 is disposed on the first insulating layer 10. The second insulating layer 20 may overlap the pixels PX11 to PXnm (see FIG. 1) in common. The second insulating layer 20 may be an inorganic layer and/or an organic layer, and may have a single layer structure or a multi-layer structure. In an embodiment, the second insulating layer 20 may be a silicon oxide layer having a single layer structure.

A third insulating layer 30 is disposed on the second insulating layer 20. In an embodiment, the third insulating layer 30 may be a silicon oxide layer having a single layer structure.

A first connection electrode CNE1 may be disposed on the third insulating layer 30. The first connection electrode CNE1 may be connected to the second electrode D6 of the sixth transistor T6 through a contact hole CNT1 passing through the first to third insulating layers 10 to 30.

A fourth insulating layer 40 covering the first connection electrode CNE1 may be disposed on the third insulating layer 30. The fourth insulating layer 40 may be a silicon oxide layer having a single layer structure. A fifth insulating layer 50 is disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT2 passing through the fourth insulating layer 40 and the fifth insulating layer 50.

A sixth insulating layer 60 covering the second connection electrode CNE2 is disposed on the fifth insulating layer 50. The sixth insulating layer 60 may be an organic layer. A seventh insulating layer 70 is disposed on the sixth insulating layer 60. An anode AE12 is disposed on the seventh insulating layer 70. The anode AE12 is connected to the second connection electrode CNE2 through the connection node CT12 passing through the sixth insulating layer 60 and the seventh insulating layer 70. An opening OP is defined on a pixel defining layer PDL. The opening OP of the pixel defining layer PDL exposes at least part of the anode AE12.

An emission layer EML is disposed on the anode AE12. The emission layer EML may be disposed in only an area corresponding to the opening OP. The emission layer EML may be formed separately in each of the pixels PX11 to PXnm (see FIG. 1).

In an embodiment, the patterned emission layer EML is illustrated. However, the emission layer EML may be disposed in the pixels PX11 to PXnm in common. At this time, the emission layer EML may generate white light or blue light. Also, the emission layer EML may have a multi-layer structure. A cathode CE is disposed on the emission layer EML. The cathode CE is disposed in the pixels PX11 to PXnm in common.

Although not shown in the drawings, a hole control layer may be interposed between the anode AE12 and the emission layer EML. Moreover, an electron control layer may be interposed between the emission layer EML and the cathode CE.

The thin film encapsulation layer TFE is disposed on the cathode CE. The thin film encapsulation layer TFE is disposed in the pixels PX11 to PXnm in common. In an embodiment, the thin film encapsulation layer TFE directly covers the cathode CE. In an embodiment of the present disclosure, a capping layer directly covering the cathode CE may be further disposed.

The thin film encapsulation layer TFE includes at least one inorganic layer or at least one organic layer. In an embodiment of the present disclosure, the thin film encapsulation layer TFE may include two inorganic layers and an organic layer disposed therebetween. In an embodiment of the present disclosure, the thin film encapsulation layer TFE may include a plurality of inorganic layers and a plurality of organic layers, which are alternately stacked.

An encapsulation inorganic layer protects the second light emitting element GE12 from moisture or oxygen. An encapsulation organic layer protects the second light emitting element GE12 from foreign objects such as dust particles. The encapsulation inorganic layer may include a silicon nitride layer, a silicon oxynitride layer, a silicon oxide layer, a titanium oxide layer, an aluminum oxide layer, or the like, but is not specifically limited thereto. The encapsulation organic layer may include an acryl-based organic layer, and is not specifically limited thereto.

Figure 8:
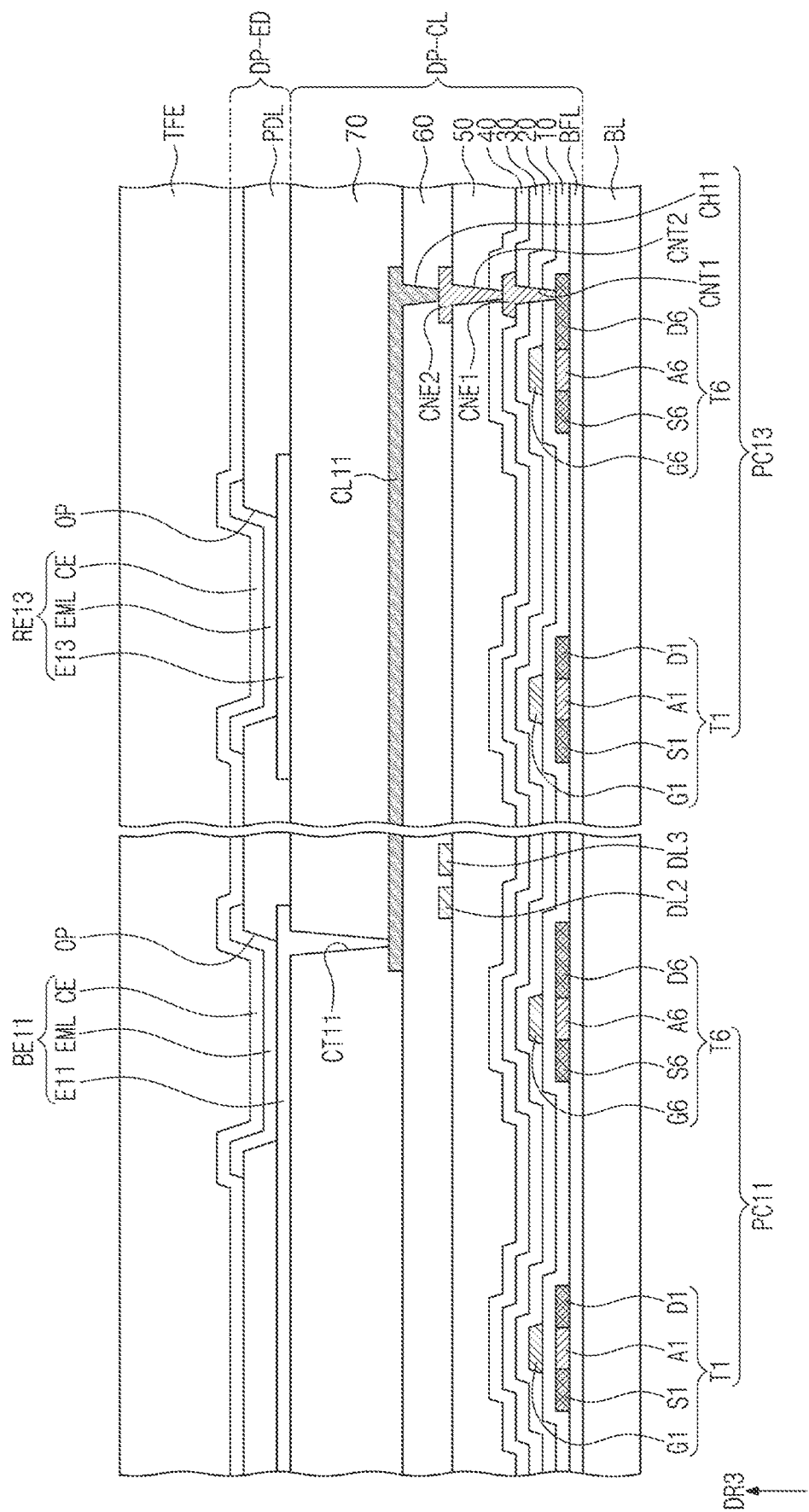
FIG. 8 is a diagram illustrating a cross-section of a part of a pixel circuit and a first light emitting element and a part of a pixel circuit and a third light emitting element in a display panel, according to an embodiment of the present disclosure.

FIG. 8 is a diagram illustrating a cross-section of a part of the pixel circuit PC11 and the first light emitting element BE11 and a part of the pixel circuit PC13 and the third light emitting element RE13 in the display panel DP, according to an embodiment of the present disclosure.

The first light emitting element BE11, the first transistor T1 of the pixel circuit PC11, and the sixth transistor T6 of the pixel circuit PC11 shown in FIG. 8 may include configurations similar to those of the second light emitting element GE12, the first transistor T1 of the pixel circuit PC12, and the sixth transistor T6 of the pixel circuit PC12 illustrated in FIG. 7. Accordingly, additional descriptions thereof will be omitted to avoid redundancy.

Moreover, the third light emitting element RE13, the first transistor T1 of the pixel circuit PC13, and the sixth transistor T6 of the pixel circuit PC11 shown in FIG. 8 may include configurations similar to those of the second light emitting element GE12, the first transistor T1 of the pixel circuit PC12, and the sixth transistor T6 of the pixel circuit PC12 illustrated in FIG. 7. Accordingly, additional descriptions thereof will be omitted to avoid redundancy.

Referring to FIG. 8, an anode E11 of the first light emitting element BE11 is connected to the connection line CL11 through the connection node CT11 passing through the seventh insulating layer 70. The connection line CL11 is connected to the second connection electrode CNE2 through the connection part CH11 (or a contact hole) passing through the sixth insulating layer 60. Accordingly, the anode E11 of the first light emitting element BE11 may be electrically connected to the second electrode D6 of the sixth transistor T6 of the pixel circuit PC13 through the connection node CT11, the connection line CL11, the connection part CH11, the second connection electrode CNE2, and the first connection electrode CNE1.

In an embodiment, the data lines DL2 and DL3 may be disposed on the fifth insulating layer 50. The data lines DL2 and DL3 may overlap the connection line CL11 in a plan view.

Figure 9:
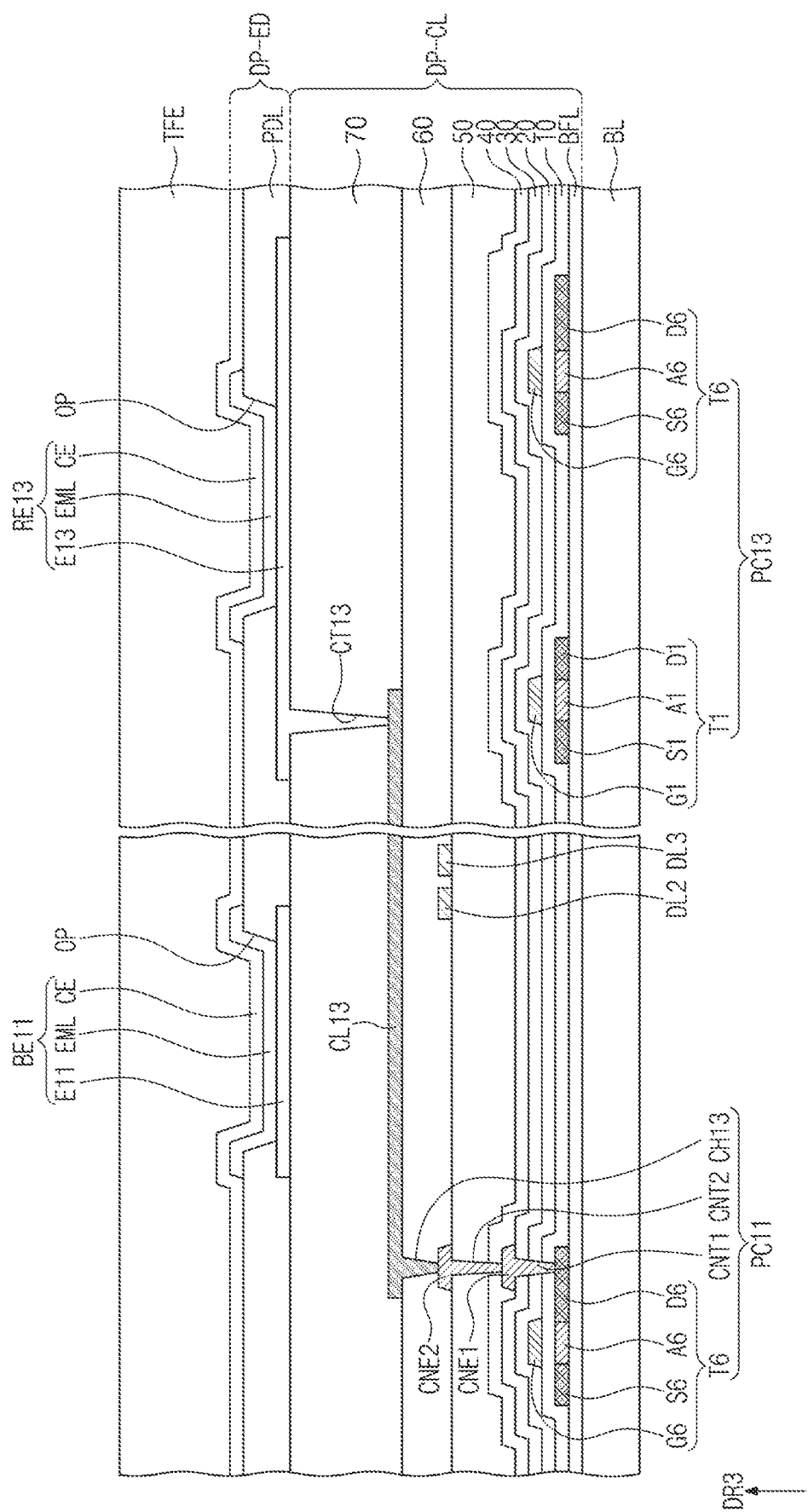
FIG. 9 is a diagram illustrating a cross-section of a part of a pixel circuit and a first light emitting element and a part of a pixel circuit and a third light emitting element in a display panel, according to an embodiment of the present disclosure.

FIG. 9 is a diagram illustrating a cross-section of a part of the pixel circuit PC11 and the first light emitting element BE11 and a part of the pixel circuit PC13 and the third light emitting element RE13 in the display panel DP, according to an embodiment of the present disclosure.

The first light emitting element BE11 and the sixth transistor T6 of the pixel circuit PC11 shown in FIG. 9 may include configurations similar to those of the second light emitting element GE12 and the first transistor T1 of the pixel circuit PC12 illustrated in FIG. 7. Accordingly, additional descriptions thereof will be omitted to avoid redundancy.

Moreover, the first light emitting element BE11 and the sixth transistor T6 of the pixel circuit PC11 shown in FIG. 9 may include configurations similar to those of the second light emitting element GE12 and the sixth transistor T6 of the pixel circuit PC12 illustrated in FIG. 7. Accordingly, additional descriptions thereof will be omitted to avoid redundancy.

Referring to FIG. 9, an anode E13 of the third light emitting element RE13 is connected to the connection line CL13 through the connection node CT13 passing through the seventh insulating layer 70. The connection line CL13 is connected to the second connection electrode CNE2 through the connection part CH13 (or a contact hole) passing through the sixth insulating layer 60. Accordingly, the anode E13 of the third light emitting element RE13 may be electrically connected to the second electrode D6 of the sixth transistor T6 of the pixel circuit PC11 through the connection node CT13, the connection line CL13, the connection part CH13, the second connection electrode CNE2, and the first connection electrode CNE1.

In an embodiment, the data lines DL2 and DL3 may be disposed on the fifth insulating layer 50. The data lines DL2 and DL3 may overlap the connection line CL13 in a plan view.

Figure 10:
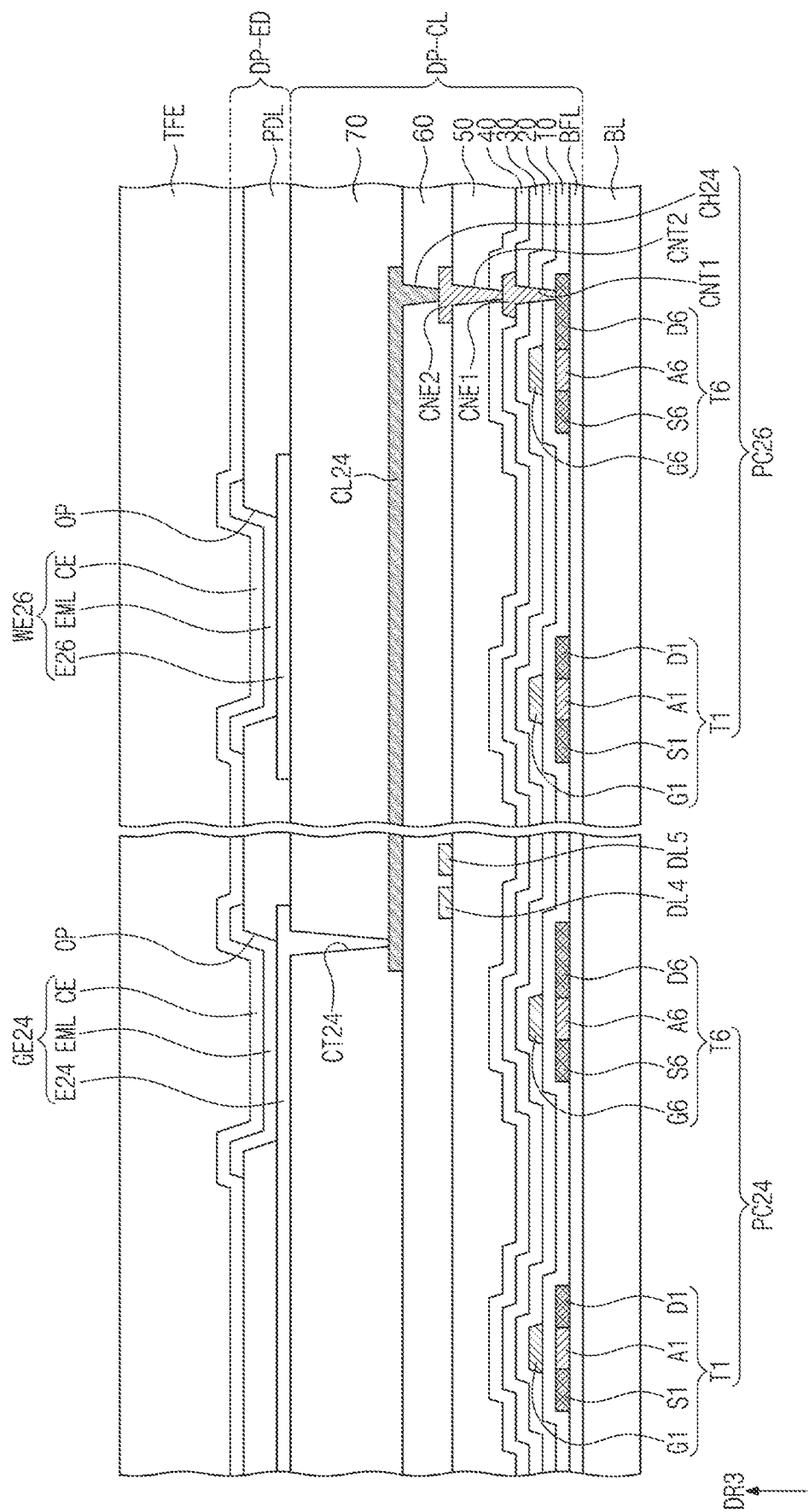
FIG. 10 is a diagram illustrating a cross-section of a part of a pixel circuit and a second light emitting element and a part of a pixel circuit and a fourth light emitting element in a display panel, according to an embodiment of the present disclosure.

FIG. 10 is a diagram illustrating a cross-section of a part of the pixel circuit PC24 and the second light emitting element GE24 and a part of the pixel circuit PC26 and the fourth light emitting element WE26 in the display panel DP, according to an embodiment of the present disclosure.

The second light emitting element GE24, the first transistor T1 of the pixel circuit PC24, and the sixth transistor T6 of the pixel circuit PC24 shown in FIG. 10 may include configurations similar to those of the second light emitting element GE12, the first transistor T1 of the pixel circuit PC12, and the sixth transistor T6 of the pixel circuit PC12 illustrated in FIG. 7. Accordingly, additional descriptions thereof will be omitted to avoid redundancy.

Moreover, the fourth light emitting element WE26, the first transistor T1 of the pixel circuit PC26, and the sixth transistor T6 of the pixel circuit PC26 shown in FIG. 10 may include configurations similar to those of the second light emitting element GE12, the first transistor T1 of the pixel circuit PC12, and the sixth transistor T6 of the pixel circuit PC12 illustrated in FIG. 7. Accordingly, additional descriptions thereof will be omitted to avoid redundancy.

Referring to FIG. 10, an anode E24 of the second light emitting element GE24 is connected to the connection line CL24 through the connection node CT24 passing through the seventh insulating layer 70. The connection line CL24 is connected to the second connection electrode CNE2 through the connection part CH24 passing through the sixth insulating layer 60. Accordingly, the anode E24 of the second light emitting element GE24 may be electrically connected to the second electrode D6 of the sixth transistor T6 of the pixel circuit PC26 through the connection node CT24, the connection line CL24, the connection part CH24, the second connection electrode CNE2, and the first connection electrode CNE1.

In an embodiment, the data lines DL4 and DL5 may be disposed on the fifth insulating layer 50. The data lines DL4 and DL5 may overlap the connection line CL24 in a plan view.

Figure 11:
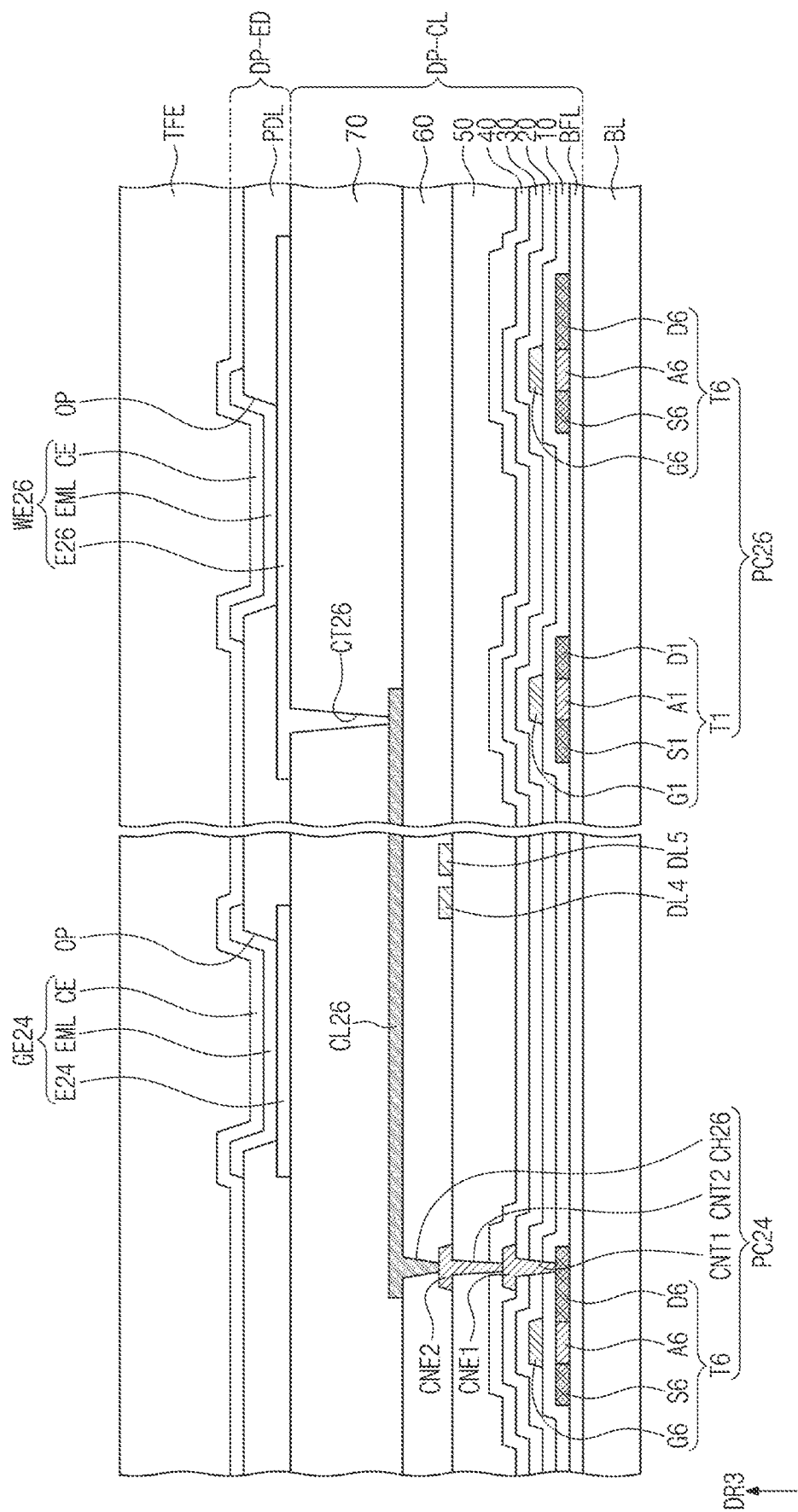
FIG. 11 is a diagram illustrating a cross-section of a part of a pixel circuit and a second light emitting element and a part of a pixel circuit and a fourth light emitting element in a display panel, according to an embodiment of the present disclosure.

FIG. 11 is a diagram illustrating a cross-section of a part of the pixel circuit PC24 and the second light emitting element GE24 and a part of the pixel circuit PC26 and the fourth light emitting element WE26 in the display panel DP, according to an embodiment of the present disclosure.

The second light emitting element GE24 and the sixth transistor T6 of the pixel circuit PC24 shown in FIG. 11 may include configurations similar to those of the second light emitting element GE12 and the sixth transistor T6 of the pixel circuit PC12 illustrated in FIG. 7. Accordingly, additional descriptions thereof will be omitted to avoid redundancy.

Moreover, the fourth light emitting element WE26, the first transistor T1 of the pixel circuit PC26, and the sixth transistor T6 of the pixel circuit PC26 shown in FIG. 11 may include configurations similar to those of the second light emitting element GE12, the first transistor T1 of the pixel circuit PC12, and the sixth transistor T6 of the pixel circuit PC12 illustrated in FIG. 7. Accordingly, additional descriptions thereof will be omitted to avoid redundancy.

Referring to FIG. 11, an anode E26 of the fourth light emitting element WE26 is connected to the connection line CL26 through the connection node CT26 passing through the seventh insulating layer 70. The connection line CL26 is connected to the second connection electrode CNE2 through the connection part CH26 passing through the sixth insulating layer 60. Accordingly, the anode E26 of the fourth light emitting element WE26 may be electrically connected to the second electrode D6 of the sixth transistor T6 of the pixel circuit PC24 through the connection node CT26, the connection line CL26, the connection part CH26, the second connection electrode CNE2, and the first connection electrode CNE1.

In an embodiment, the data lines DL4 and DL5 may be disposed on the fifth insulating layer 50. The data lines DL4 and DL5 may overlap the connection line CL26 in a plan view.

Although an embodiment of the present disclosure has been described for illustrative purposes, those skilled in the art will appreciate that various modifications, and substitutions are possible, without departing from the scope and spirit of the present disclosure as disclosed in the accompanying claims. Accordingly, the technical scope of the present disclosure is not limited to the detailed description of this specification, but should be defined by the claims.

A display device having such a configuration may include at least four light emitting elements that provide different light.

A data driving circuit outputs only data signals of different colors to first to fourth data lines. That is, because each of the first to fourth data lines outputs only a data signal corresponding to one color, power consumption of the display device may be reduced.

Moreover, degradation of display quality may be prevented by minimizing a coupling capacitance deviation between data lines.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display panel comprising:
   a first data line;
   a second data line;
   a third data line;
   a fourth data line;
   a first pixel circuit arranged in a first row and connected to the first data line;
   a second pixel circuit arranged in the first row and connected to the second data line;
   a third pixel circuit arranged in a second row and connected to the third data line;
   a fourth pixel circuit arranged in the second row and connected to the fourth data line;
   first to fourth light emitting elements which emit light of different colors;
   a first connection line which connects the first light emitting element to the second pixel circuit;
   a second connection line which connects the second light emitting element to the first pixel circuit;
   a third connection line which connects the third light emitting element to the fourth pixel circuit; and
   a fourth connection line which connects the fourth light emitting element to the third pixel circuit,
   wherein the first connection line and the second connection line overlap the second data line in a plan view, and
   wherein the third connection line and the fourth connection line overlap the third data line in the plan view.

2. The display panel of claim 1, wherein a part of the first light emitting element overlaps the first pixel circuit in the plan view,
   wherein a part of the second light emitting element overlaps the second pixel circuit in the plan view,
   wherein a part of the third light emitting element overlaps the third pixel circuit in the plan view, and
   wherein a part of the fourth light emitting element overlaps the fourth pixel circuit in the plan view.

3. The display panel of claim 1, wherein the first light emitting element emits first color light,
   wherein the second light emitting element emits second color light,
   wherein the third light emitting element emits third color light, and
   wherein the fourth light emitting element emits fourth color light.

4. The display panel of claim 3, wherein the first color light, the second color light, the third color light, and the fourth color light correspond to blue, red, green, and white respectively.

5. The display panel of claim 3, wherein the first data line delivers a first data signal corresponding to the first color light,
   wherein the second data line delivers a second data signal corresponding to the second color light,
   wherein the third data line delivers a third data signal corresponding to the third color light, and
   wherein the fourth data line delivers a fourth data signal corresponding to the fourth color light.

6. The display panel of claim 1, wherein the first data line is adjacent to a left side of the first pixel circuit,
   wherein the second data line is adjacent to a left side of the second pixel circuit and is positioned between the first pixel circuit and the second pixel circuit,
   wherein the third data line is adjacent to a right side of the third pixel circuit and is positioned between the third pixel circuit and the fourth pixel circuit, and
   wherein the fourth data line is adjacent to a right side of the fourth pixel circuit.

7. A display panel comprising:
   a first data line;
   a second data line;
   a third data line;
   a fourth data line;
   a first pixel arranged in a first row and connected to the first data line;
   a second pixel arranged in the first row and connected to the second data line;
   a third pixel arranged in a second row and connected to the third data line; and
   a fourth pixel arranged in the second row and connected to the fourth data line,
   wherein the first pixel includes a first pixel circuit and a second light emitting element,
   wherein the second pixel includes a second pixel circuit overlapping the second light emitting element, and a first light emitting element overlapping the first pixel circuit in a plan view,
   wherein the third pixel includes a third pixel circuit and a fourth light emitting element,
   wherein the fourth pixel includes a fourth pixel circuit overlapping the fourth light emitting element, and a third light emitting element overlapping the third pixel circuit in the plan view, and
   wherein the first light emitting element, the second light emitting element, the third light emitting element, and the fourth light emitting element emit different color lights from one another.

8. The display panel of claim 7, further comprising:
   a first connection line which connects the first light emitting element to the second pixel circuit;
   a second connection line which connects the second light emitting element to the first pixel circuit;
   a third connection line which connects the third light emitting element to the fourth pixel circuit; and
   a fourth connection line which connects the fourth light emitting element to the third pixel circuit,
   wherein the first connection line and the second connection line overlap the second data line in the plan view, and
   wherein the third connection line and the fourth connection line overlap the third data line in the plan view.

9. The display panel of claim 7, wherein the first light emitting element emits first color light,
wherein the second light emitting element emits second color light,
wherein the third light emitting element emits third color light, and
wherein the fourth light emitting element emits fourth color light.

10. The display panel of claim 9, wherein the first color light, the second color light, the third color light, and the fourth color light correspond to blue, red, green, and white respectively.

11. The display panel of claim 9, wherein the first data line delivers a first data signal corresponding to the first color light,
wherein the second data line delivers a second data signal corresponding to the second color light,
wherein the third data line delivers a third data signal corresponding to the third color light, and
wherein the fourth data line delivers a fourth data signal corresponding to the fourth color light.

12. A display device comprising:
a display panel including first to fourth pixels connected to a plurality of insulating layers, first to fourth connection lines, and first to fourth data lines,
wherein the first pixel includes a second light emitting element including an anode and a cathode, and a first pixel circuit,
wherein the second pixel includes a first light emitting element including an anode and a cathode, and a second pixel circuit,
wherein the plurality of insulating layers includes a first insulating layer disposed on the first pixel circuit and the second pixel circuit, a second insulating layer disposed on the first insulating layer, and a third insulating layer disposed on the second insulating layer,
wherein the first to fourth data lines are interposed between the first insulating layer and the second insulating layer,
wherein the first to fourth connection lines are interposed between the second insulating layer and the third insulating layer,
wherein the anode of the first light emitting element and the anode of the second light emitting element are disposed on the third insulating layer,
wherein the anode of the first light emitting element is connected to the first connection line through a first connection node passing through the third insulating layer,
wherein the first connection line is connected to the second pixel circuit through a first contact hole passing through the second insulating layer and a second contact hole passing through the first insulating layer, and
wherein the first connection line overlaps the second data line in a plan view.

13. The display device of claim 12, wherein the anode of the second light emitting element is connected to the second connection line through a second connection node passing through the third insulating layer,
wherein the second connection line is connected to the first pixel circuit through a third contact hole passing through the second insulating layer and a fourth contact hole passing through the first insulating layer, and
wherein the second connection line overlaps the second data line in the plan view.

14. The display device of claim 12, wherein the first light emitting element overlaps the first pixel circuit, and the second light emitting element overlaps the second pixel circuit in the plan view.

15. The display device of claim 12, wherein the third pixel includes a fourth light emitting element including an anode and a cathode, and a third pixel circuit,
wherein the fourth pixel includes a third light emitting element including an anode and a cathode, and a fourth pixel circuit,
wherein the anode of the third light emitting element and the anode of the fourth light emitting element are disposed on the third insulating layer,
wherein the anode of the third light emitting element is connected to the third connection line through a third connection node passing through the third insulating layer,
wherein the third connection line is connected to the fourth pixel circuit through a fifth contact hole passing through the second insulating layer and a sixth contact hole passing through the first insulating layer, and
wherein the third connection line overlaps the third data line in the plan view.

16. The display device of claim 15, wherein the anode of the third light emitting element and the anode of the fourth light emitting element are disposed on the third insulating layer,
wherein the anode of the fourth light emitting element is connected to the fourth connection line through a fourth connection node passing through the third insulating layer,
wherein the fourth connection line is connected to the third pixel circuit through a seventh contact hole passing through the second insulating layer and an eighth contact hole passing through the first insulating layer, and
wherein the fourth connection line overlaps the third data line in the plan view.

17. The display device of claim 16, wherein the third light emitting element overlaps the third pixel circuit, and the fourth light emitting element overlaps the fourth pixel circuit in the plan view.

18. The display device of claim 12, wherein the first pixel and the second pixel are arranged in a first row, and
wherein the third pixel and the fourth pixel are arranged in a second row.

19. The display device of claim 12, wherein the first light emitting element emits first color light,
wherein the second light emitting element emits second color light,
wherein the third light emitting element emits third color light, and
wherein the fourth light emitting element emits fourth color light.

20. The display device of claim 19, wherein the first data line delivers a first data signal corresponding to the first color light,
wherein the second data line delivers a second data signal corresponding to the second color light,
wherein the third data line delivers a third data signal corresponding to the third color light, and
wherein the fourth data line delivers a fourth data signal corresponding to the fourth color light.

* * * * *